(12) United States Patent
Saito et al.

(10) Patent No.: US 7,317,742 B2
(45) Date of Patent: Jan. 8, 2008

(54) OPTICAL SUB-ASSEMBLY HAVING A THERMO-ELECTRIC COOLER AND AN OPTICAL TRANSCEIVER USING THE OPTICAL SUB-ASSEMBLY

(75) Inventors: Shin'ichiro Saito, Yokohama (JP); Eiji Tsumura, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 288 days.

(21) Appl. No.: 11/057,387

(22) Filed: Feb. 15, 2005

(65) Prior Publication Data
US 2006/0083517 A1  Apr. 20, 2006

Related U.S. Application Data

(60) Provisional application No. 60/545,504, filed on Feb. 19, 2004, provisional application No. 60/592,527, filed on Aug. 2, 2004, provisional application No. 60/632,716, filed on Dec. 3, 2004.

(51) Int. Cl.
*H01S 3/10* (2006.01)
*H01S 3/04* (2006.01)
*H01S 5/00* (2006.01)

(52) U.S. Cl. .................. 372/34; 372/26; 372/50.1
(58) Field of Classification Search .............. 372/26, 372/34, 50.1
See application file for complete search history.

(56) References Cited

U.S. PATENT DOCUMENTS 5,345,373 A  9/1994 Tanida (Continued)

FOREIGN PATENT DOCUMENTS

JP  05-150146  6/1993

(Continued)

OTHER PUBLICATIONS

U.S. Appl. No. 11/057,412, filed Feb. 15, 2005.

(Continued)

*Primary Examiner*—Armando Rodriguez
(74) *Attorney, Agent, or Firm*—Smith, Gambrell & Russell, LLP

(57) ABSTRACT

The present invention relates to an optical transceiver that installs an optical transmitting assembly and an optical receiving assembly both are compact, inexpensive, and capable of operating at a high speed. The optical transmitting assembly of the present invention provides the metal bottom that installs the thermoelectric cooler thereon and the semiconductor optical device is mounted, via the insulating substrate, on the thermoelectric cooler. The first and second multi-layered ceramic substrates are provided to surround the thermoelectric cooler. The DC signal or the low-frequency signal for the thermoelectric cooler and the semiconductor optical device is supplied through the first ceramic substrate, while the high frequency signal for the semiconductor device, with the complementary signal having the opposite phase to the high frequency signal, is provided to the semiconductor device through the inner layer of the second ceramic substrate and the insulating substrate. The semiconductor light-receiving device, which monitors light emitted from the semiconductor light-emitting device, is mounted on the top layer of the second ceramic substrate. Thus, the transmission path for the high frequency signal from the drive circuit installed outside of the transmitting assembly to the light-emitting device becomes substantially linear.

15 Claims, 14 Drawing Sheets

U.S. PATENT DOCUMENTS

| | | |
|---|---|---|
| 5,602,672 A | 2/1997 | Ishimura et al. |
| 6,823,145 B1 | 11/2004 | Shirai et al. |
| 6,876,682 B2 | 4/2005 | Nakabayashi et al. |
| 2003/0128552 A1 | 7/2003 | Takagi et al. |

FOREIGN PATENT DOCUMENTS

| | | |
|---|---|---|
| JP | 06-318763 | 11/1994 |
| JP | 10-275957 | 10/1998 |
| JP | 11-126946 | 5/1999 |
| JP | 2000-277843 | 10/2000 |
| JP | 2002-162541 | 6/2002 |
| JP | 2003-198033 | 7/2003 |
| JP | 2003-215406 | 7/2003 |

OTHER PUBLICATIONS

U.S. Appl. No. 11/057,388, filed Feb. 15, 2005.

OPTICAL SUB-ASSEMBLY HAVING A THERMO-ELECTRIC COOLER AND AN OPTICAL TRANSCEIVER USING THE OPTICAL SUB-ASSEMBLY

CROSS REFERENCE TO RELATED APPLICATIONS

The present application claims benefit of prior filed provisional applications Ser. No. 60/545,504, filed Feb. 19, 2004, Ser. No. 60/592,527, filed Aug. 2, 2004, and Ser. No. 60/632,716, filed Dec. 3, 2004.

BACKGROUND OF THE INVENTION

1. Field of the Invention

The present invention relates to an optical transmitting assembly used in high-speed optical communication (for example, 10 Gbps) that provides a temperature control function within a small sized package.

2. Related Prior Art

The optical communication strongly requests an optical transceiver applicable to the high-speed transmission with a miniaturized package. For example, a multi-source agreement (MSA) has been standardized for the miniaturized optical transceiver with a pluggable function at the transmitting speed of 10 Gbps. This standard rules to provide an optical receptacle capable of mating with a dual LC-type$^M$ optical connector. The pitch between two lines is 6.25 mm. The height and the width of the pluggable transceiver are set to 18.35 mm and 8.5 mm, respectively, because these transceivers are mounted in the motherboard with high density. Therefore, such optical transceiver with a narrower width, i.e., with a narrower cross section, requires the miniaturized optical transmitting assembly and the miniaturized optical receiving assembly to be installed within such small sized optical transceiver.

On the other hand, as the transmission speed increases, the power consumption of semiconductor devices also increases to operate in stable for the high-speed signal. Moreover, to transmit the optical signal in a long distance at the high-speed, the semiconductor laser diode (herein after denoted as LD) must satisfy a severe chirping characteristic. The direct modulation for the LD can not satisfy such high quality specification, One type of an optical modulator, so called the EA (Electro-Absorption) modulator, is well known, which utilizes the dependence of the absorption co-efficient of the semiconductor material on the electric field. An EA-DFB device that monolithically integrates the EA modulator with the DFB laser diode is also well known in the field. To operate this EA-DFB device in stable and in precise its output wavelength and output optical power requires the temperature of the device in stable. Accordingly, the thermoelectric cooler, typically the Peltier cooler, is necessary to install within the optical assembly. However, it will be necessary to enlarge the thermoelectric cooler to obtain the temperature controlled with good quality. Accordingly, the optical transceiver for the application of the high speed and the long distance requires the optical assembly that installs such enlarged thermoelectric cooler and is to be installed within the transceiver with the specified dimensions.

To obtain small-sized optical assembly, it will be necessary to have the thermoelectric cooler small, but it will restrict the capacity of the cooling of the thermoelectric cooler. In general, the thermoelectric cooler has an upper plate made of insulating material, typically aluminum nitride (AlN). It will be preferable to configure a carrier, on which the EA-DFB device is mounted, made of metal whose thermal expansion coefficient matches with that of those insulating material to prevent the thermal stress when these two material are in contact to each other. On the other hand, the carrier is preferably made of material with good thermal conductivity to reduce the thermal resistance between the laser diode, which becomes a heat source, and the upper plate, which becomes the cooling surface, accordingly, to relief the capacity of the cooling of the thermoelectric cooler.

From the aforementioned viewpoint, the carrier is typically made of CuW. However, the CuW has relatively large heat capacity. That is, assuming that the total heat capacity of materials installed on the thermoelectric cooler is C [J/C], and the thermoelectric cooler is booted under the ambient temperature 75° C., it is necessary to transport the heat Qt [W]=C×*(75−25)/30=1.67×C by the thermoelectric cooler to lower the temperature thereof to 25° C. Therefore, to install members having large heat capacity such as CuW disturbs the lightening of the capability of the thermoelectric cooler.

In the case that the EA-DFB device modulates light, it is necessary to carry the modulation signal over a few GHz to the EA-DFB device without degrading the quality thereof, accordingly, the transmission line carrying the signal is necessary to terminate immediate the EA-DFB device with a resistor having predefined resistance. Thus arranging the termination resistor can carry the signal to the EA device with good quality and without undesired reflection of the high frequency signal by matching the transmission impedance.

A typical EA-DFB device is necessary to be supplied, for the bias current, 100 mA at most to emit the DFB portion thereof. On the other hand, the forward voltage of the DFB portion becomes about 1.5 V, accordingly, the EA-DFB device generates heat of about 0.15 W only in the DFB portion. Moreover, an average bias voltage for the EA portion, which is a sum of the bias voltage and a half of the modulation amplitude, becomes about 1.5 V Therefore, assuming the value of the termination resistor is 50Ω, the termination resistor generates heat of 0.045 W. Moreover, the EA portion is known that it generally generates the current, due to the photo absorption, of about 15 mA, which equivalently generates heat of 0.015 W Thus, when using the EA-DFB device, much heat is generated compared with the case that the DFB-LD is directly modulated, which brings further subjects for miniaturization of the thermoelectric cooler.

Furthermore, in the EA-DFB device, in particular, the EA portion and the is DFB portion are integrated to each other, the high frequency signal applied to the EA portion has leaked to the DFB device that is inherently driven by the DC signal. When the ground electrode, typically the back surface electrode, becomes low impedance enough, this phenomenon does not appear. However, the EA-DFB device is installed within the package, the ground line can not widen and shorten enough due to less space within the package, which makes the ground line the common impedance to the EA portion and the DFB portion. Therefore, the high frequency signal applied to the EA portion appears in deformed, so the optical output because the EA portion is driven by this deformed signal, which increases the jitter and the noise involved in the optical output. For the DFB portion, the oscillation spectrum thereof has widened because, in spite of being drive by the DC signal, the high frequency signal leaks from the EA portion through the common impedance, which causes the chirp on the oscillation wavelength. These phenomena strongly affect the optical transmission characteristic and become one of primary reason to suppress the transmission distance.

Moreover, in products intended to operate in the high speed, how the dynamic testing can be performed dominates not only the performance of the products but also the cost thereof. When the dynamic testing is carried out after the completion of the product, the reliability of the testing may be secured. However, once deciding the failure for the product, all parts must be scraped although the failure is attributed to only a portion of parts. On the other hand, when the dynamic testing is carried out during the production, the reliability of the testing itself may not be secured due to the difference between the final and the intermediate configurations.

Furthermore, for the semiconductor light-emitting device and the semiconductor optical modulating device, a burn-in testing, typically called as the screening test, is often processed to remove failure products that may break in a short time. Operating under a predetermined condition, such as 85° C. for 48 hours, and comparing the characteristic of the device such as the threshold current, the emission efficiency, and the modulation performance, products showing relative large change for such characteristics before and after the operation should be dropped from the production. Thus, not only enhancing the reliability of the final products, but also the total production cost may be reduced. From this viewpoint, the configuration is necessary to enable the testing as the light-emitting device is mounted on the carrier.

SUMMARY OF THE INVENTION

One aspect of the present invention relates to a transmitting optical sub-assembly. This transmitting optical sub-assembly comprises a semiconductor light-emitting device and a thermoelectric cooler. The light-emitting device emits light by providing a modulation signal. The thermoelectric cooler controls a temperature of the light-emitting device. The transmitting optical sub-assembly of the present invention further provides an insulating carrier mounted on the thermoelectric cooler where the semiconductor light-emitting device is mounted thereon. The carrier includes a first mounting surface and an inner ground layer. On the first mounting surface provides the light-emitting device, the first transmission is line transmitting the modulation signal, the first terminator connected to the first transmission line, and a surface ground layer connected to the inner ground layer.

The first terminator may be connected in serial to the first transmission line or may be connected between the first transmission line and the surface ground layer. The transmitting optical sub-assembly of the invention may further comprise a second transmission line and a second terminator connected to the second transmission line. The second transmission line transmits another modulation signal with a phase opposite to the phase of the modulation signal. A first distance from light-emitting device to the first terminator may be shorter than a second distance from the light-emitting device to the second terminator. By this arrangement, the light-emitting device may be escaped from heat generated by the second terminator. On the other hand, the first terminator may be positioned immediate to the light-emitting device not to degrade the quality of the high frequency signal.

The transmitting optical sub-assembly may further provide a multi-layered ceramic substrate to transmit the modulation signal to the first transmission line and the another modulation signal to the second transmission line each formed on the carrier. Further, a difference between the first and second distances may be compensated on the multi-layered ceramic substrate.

Moreover, the transmitting optical sub-assembly may provide a package with a package ground. The surface ground and the inner ground connected to the surface ground is preferably isolated from this package ground. In this arrangement, the high frequency signal transmitted on the carrier can be escaped from degrading in the waveform thereof and from the noise superposed on the package ground.

The insulating carrier may be made of aluminum nitride (AlN). Since the AlN shows a good thermal conductivity, and a small heat capacity, the thermal load affected to the thermoelectric cooler can be reduced. This results in a compact sized thermoelectric cooler. Moreover, on the carrier made of AlN may be formed with the second mounting surface. A collimating lens made of glass may be directly mounted on the second mounting surface without any metallic lens holder. This configuration does not affect a large heat capacity attributed to the metallic lens holder to the thermoelectric cooler. Further, a level of the first mounting surface may be higher than a level of the second mounting surface.

The light-emitting device may include a semiconductor laser diode and a semiconductor optical modulator. The laser diode emits light in continuous wave (CW) by providing a bias current. The optical modulation modulates the CW light emitted from the laser diode by providing the modulation signal. The laser diode and the optical modulator may be integrated in one body.

The light-emitting device may be a semiconductor laser diode. In this case, the first terminator is preferably connected in serial to the first transmission line. Since the parasitic resistance of the laser diode is a range from a few ohms to over ten ohms, the first transmission line can be terminated to 50 ohm by connecting the first terminator with over ten ohms in serial to the first transmission line. According to this configuration, the high frequency modulation signal transmitting on the first transmission line can be escaped from degrading in the waveform thereof.

In a modification, the light-emitting device may be a semiconductor laser diode with a first electrode and a second electrode. The first and second transmission lines may be formed on the carrier, and the first and second terminator may be formed on the carrier. The first terminator is connected to the first electrode of the laser diode, while the second terminator is connected to the second electrode of the laser diode. The modulation signal may be provided in the first transmission line, while on the second transmission line may be provided with another modulation signal whose phase is opposite to that of the modulation signal. Thus configured differential mode driving can operate the laser diode in further stable at the high frequencies.

Figure 13:
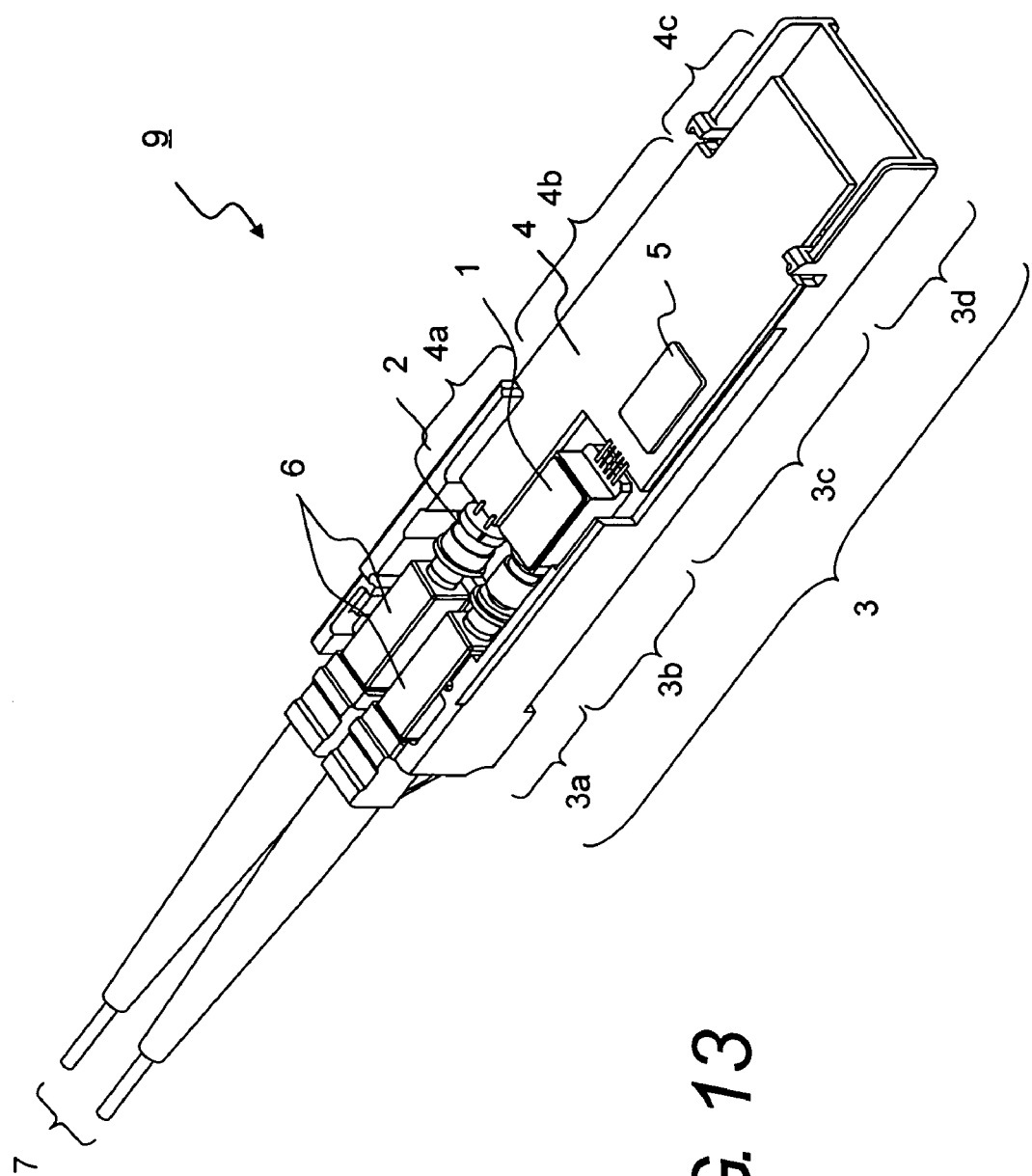
Figure 14A:
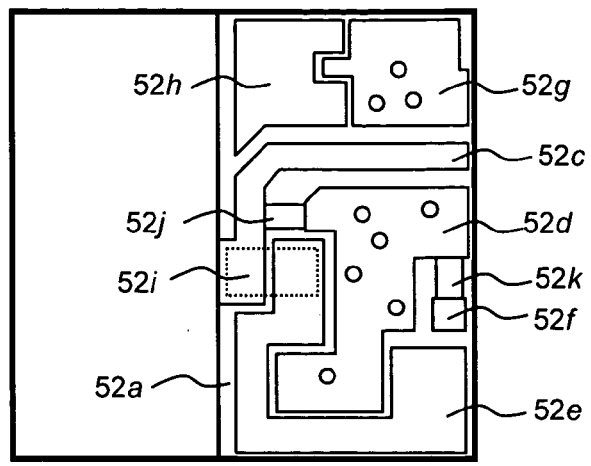
Figure 14B:
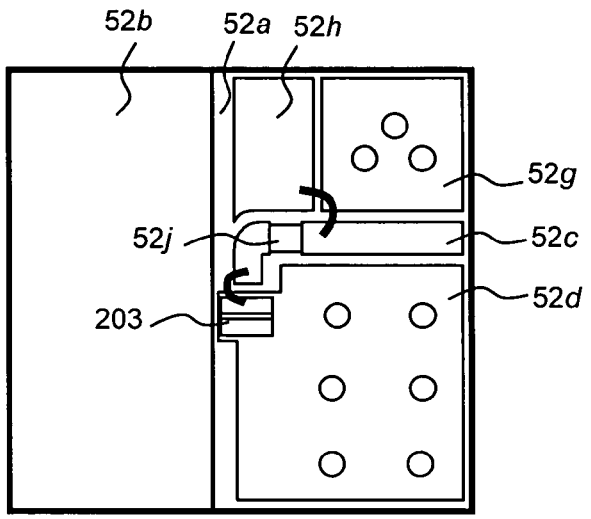
Figure 14C:
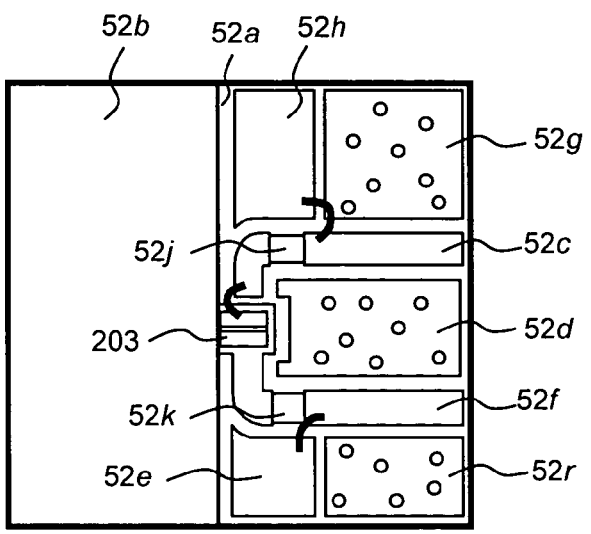

From FIG. 12A to FIG. 12E illustrates a process for assembling the carrier and for testing the device with the carrier;

FIG. 13 is a perspective view of the optical transceiver installing the transmission optical assembly; and From FIG. 14A to FIG. 14C illustrates another embodiment according to the present invention.

DETAILED DESCRIPTION OF PREFERRED EMBODIMENTS

Figure 1:
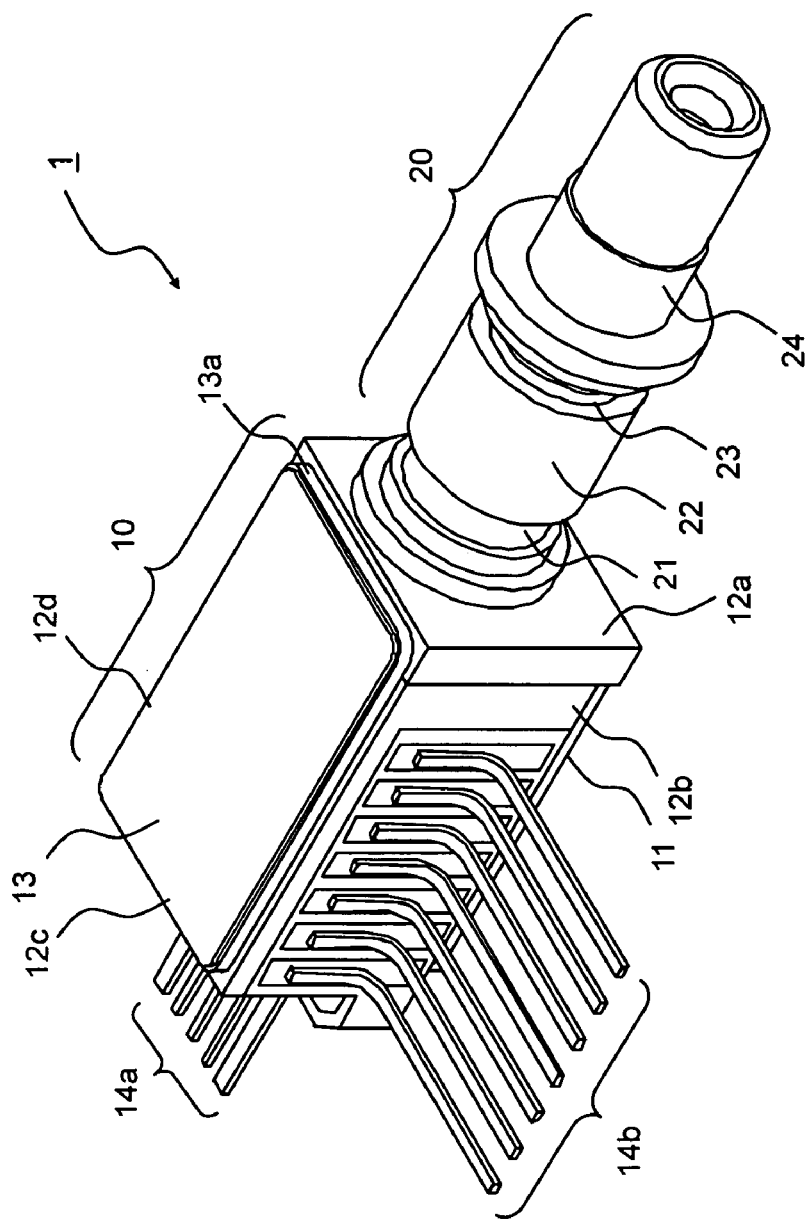
FIG. 1 illustrates an external appearance of the optical transmitting assembly according to the present invention.

FIG. 1 illustrates an external appearance of the optical transmitting assembly of the present invention.

The optical transmitting assembly includes a box-shaped package 10 and an optical coupling portion 20 attached to one side wall 12a of the package 10. The package 10 has, so called, a butterfly shape with a bottom 11, four side walls 12a to 12d disposed on the bottom 11, and a ceiling 13. One side wall 12a provides the optical coupling portion 20. The other side wall 12c opposite to this side wall 12a arranges lead pins 14a. These lead pins 14a are to provide a high-frequency modulation signal to a semiconductor optical device installed within the optical transmitting assembly. Further, in the third wall 12b intersecting the first wall 12a and the second wall 12c facing the first wall 12a also arranges a plurality of lead pins 14b, through which DC signals or low frequency signals, such as the electric power to an thermoelectric cooler, an output from a temperature sensor, an output from a light-receiving device, are transmitted. The rest side wall 12d arranges no lead pin.

Figure 2A:
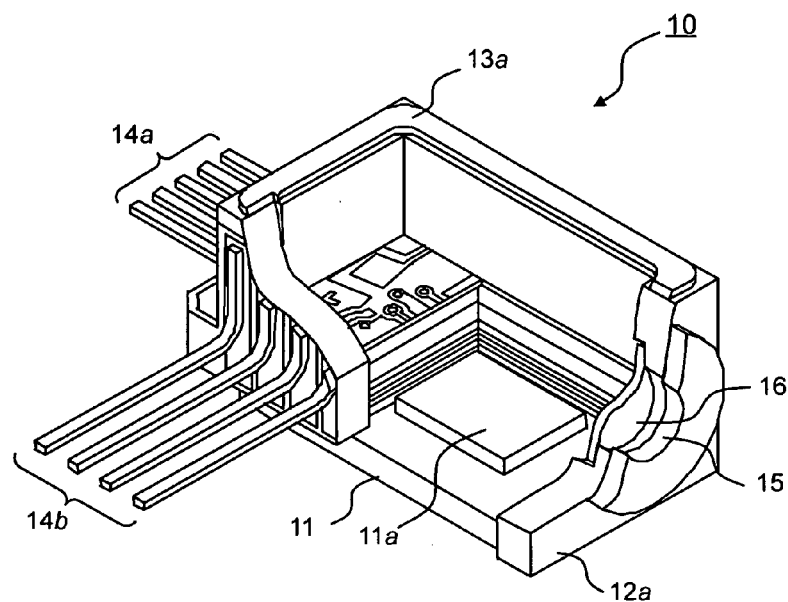
FIG. 2A is a cutaway to illustrate the inside of the optical transmitting assembly.
Figure 2B:
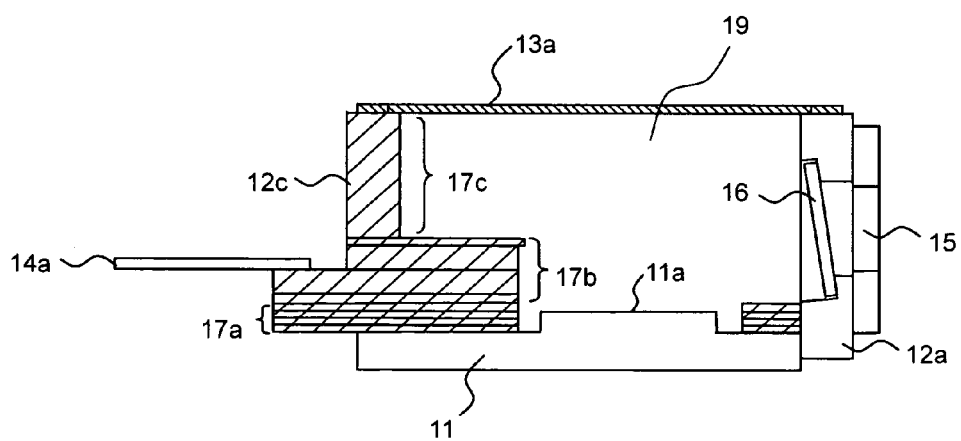
FIG. 2B is a side cross-section of the optical transmitting assembly.

FIG. 2A is a cutaway and FIG. 2B is a side cross-section of the package 10. The bottom 11 of the package 10 is made of material with good thermal conductivity, typically CuW A center portion of the bottom 11 forms a terrace 11a onto which the thermoelectric cooler is to be mounted. The terrace, because the top thereof is elevated from the peripheral, prevents the electrode of the thermoelectric cooler from short-circuiting to the bottom 11 with the surplus solder. The side wall 12 is fixed to the bottom 11 with the brazing, which secures the air-tight seal of the package. The side wall 12 is comprised of multi-layered ceramic substrates 17a, 17b and 17c, and a metal portion made of, for example, Kovar$^M$. The multi-layered ceramic substrates comprises of the first multi-layered ceramic substrate 17a, the second multi-layered ceramic substrate 17b piled on the first multi-layered ceramic substrate 17a, and the third ceramic substrate 17c, which corresponds to the side walls from 12c to 12d, piled on the second multi-layered ceramic substrate 17b. On the other hand, the side wall 12a, onto which the optical coupling portion 20 is secured, is made of metal such as Kovar$^M$ in order to fix the optical coupling portion 20 thereto by the welding after the optical alignment. These ceramic substrates and the metal form a cavity 19 within the package 10 in which the devices are installed. The side wall 12a made of metal forms an aperture 15 with a substantially circular shape. The aperture 15 is covered with a transparent plate 16 to seal the cavity 19. The ceramic substrates 17a and 17b form multi-layered interconnections on the top and the inside thereof, which electrically connect the devices arranged within the package to the lead pins disposed on the side walls.

The side wall 12 provides a seal ling made of Kovar$^M$ on the top surface thereof with the brazing, and a top plate, which is also made of Kovar$^M$, not illustrated in figures, seam-seals the package.

Figure 3A:
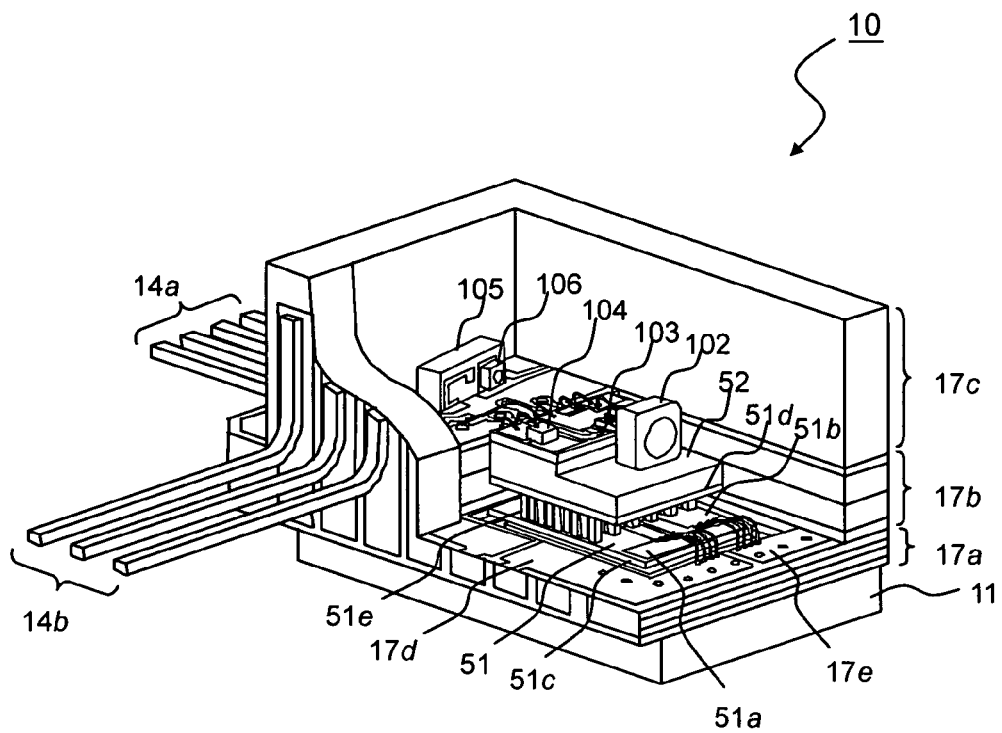
FIG. 3A is a cutaway to illustrate the inside of the optical transmitting assembly that installs parts therein.

FIG. 3A illustrates a cutaway of the package 10 installing the thermoelectric cooler 50, the semiconductor light-emitting device 103, and the semiconductor light-receiving device 106 therein. The semiconductor light-receiving device may be a semiconductor laser diode or a semiconductor laser diode integrated with a semiconductor optical modulator. The semiconductor light-receiving device 106 may be a photodiode.

The terrace 11a of the bottom 11 mounts the thermoelectric cooler 51 thereon. The thermoelectric cooler 51 configures a plurality of Peltier elements, each having an n-type element and a p-type element, sandwiched by the lower plate 51c and the upper plate 51d. The lower plate 51c provides first and second electrodes 51a and 51b. Corresponding to these electrodes 51a and 51b, the multi-layered ceramic substrate 17a also provides first and second electrodes 17d and 17e on the top surface thereof connected to respective electrodes 51a and 51b on the lower plate 51c with a plurality of bonding-wires. The first and second electrodes on the multi-layered ceramic substrate 17a are connected to the lead pins 14b arranged in the side wall 12b of the package 10 via interconnections formed on the top surface and within the intermediate layer of the multi-layered ceramic substrate 17a. When the thermoelectric cooler 51 is powered via the lead pins 14b, the upper plate 51d may be heated up or cooled down with respect to the lower plate 51c depending on the direction of the supplied current.

Figure 4:
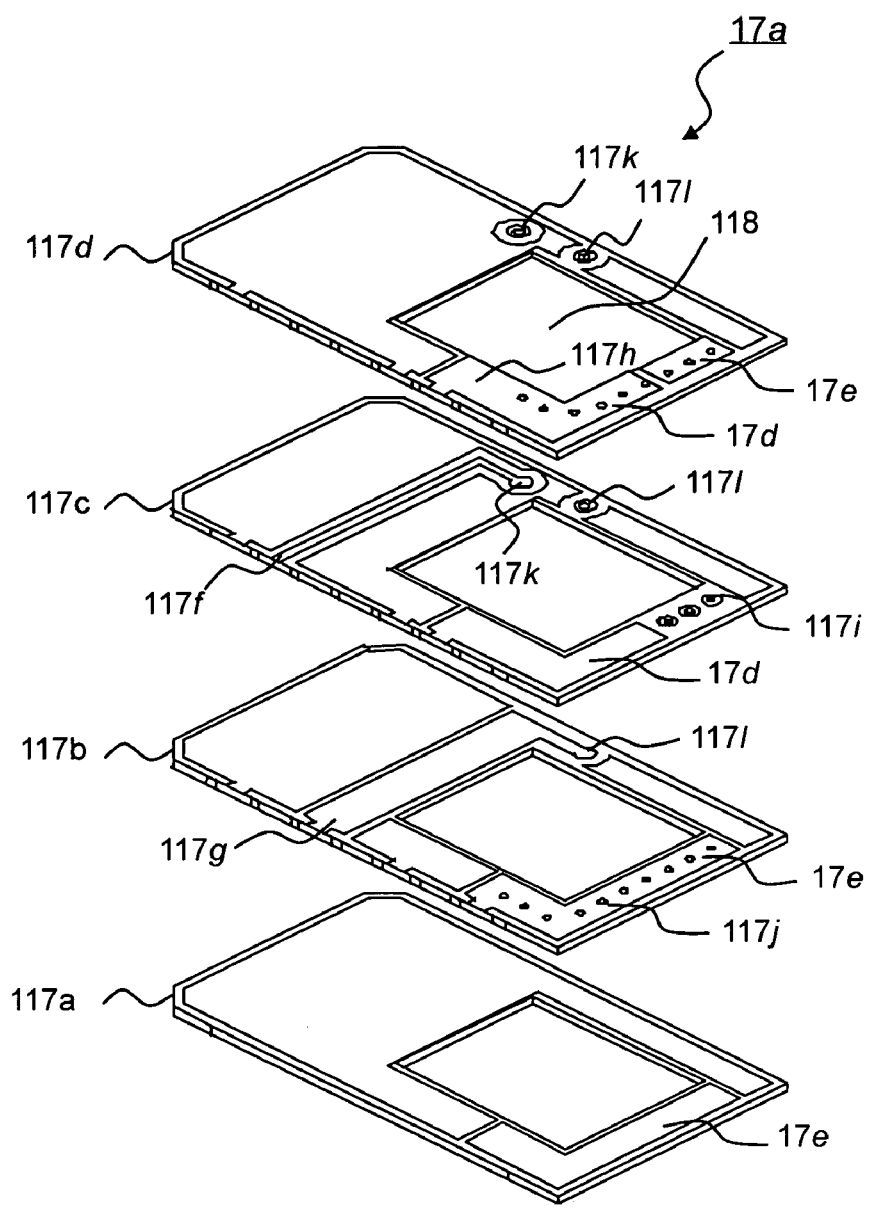
FIG. 4 is an exploded view of the first multi-layered ceramic substrate.

When the thermoelectric cooler 51 operates, a current over 1 A is occasionally supplied thereto. In the case that the wiring resistance from the lead pins 14b to the lower and upper plate 51c and 51d is large, a large scale driving circuit for the thermoelectric cooler 51 is required, because the surplus power is consumed by this wiring. In the present embodiment, the lead pins 14b directly come in contact to the first and second electrodes, 17d and 17e, on the first multi-layered ceramic substrate 17a, and these electrodes 17d and 17e are, as illustrated in FIG. 4, have a plurality of wiring layers and relatively wider width to reduce the wiring resistance. Further, a plurality of bonding-wires connects these electrodes 17d and 17e, to the thermoelectric cooler 51. Accordingly, the wiring resistance from the lead pins 14b to the thermoelectric cooler 51 may be smaller than 0.1Ω summing up both sides of the first and second electrodes, 51a and 51b.

FIG. 4 illustrates the stack of the first multi-layered ceramic substrate 17a. The first ceramic substrate 17a comprises four layers (117a to 117d). Each layer is made of aluminum nitride (AlN) or aluminum oxide ($Al_2O_3$) and has an opening in a center portion thereof. The opening positions the terrace 11a formed in the bottom 11. Accordingly, the thermoelectric cooler 51, mounted on the terrace 11a, pass through this opening to expose the upper plate 51d thereof from the opening. The lowest layer 117a and the second layer 117b form the interconnection heading the second electrode 17e, while the third layer 117c and the top layer 117d form another interconnection heading the first electrode 17d. A plurality of via holes, 117i and 117j, connects the interconnection in the bottom layer 117a to that in the second layer 117b, and the interconnection in the third layer 117c to that in the top layer 117d, respectively. The first multi-layered ceramic substrate arranges, in addition to those interconnections, 17d and 17e, to the thermoelectric cooler 51, the interconnection 117f to provide the DC current to the semiconductor light-emitting device 103 and another interconnection 117g to transmit the output from the semiconductor light-receiving device 104 to the outside via the lead pins 14b in the third 117c, second 117b, and the top layer 117d.

Figure 5A:
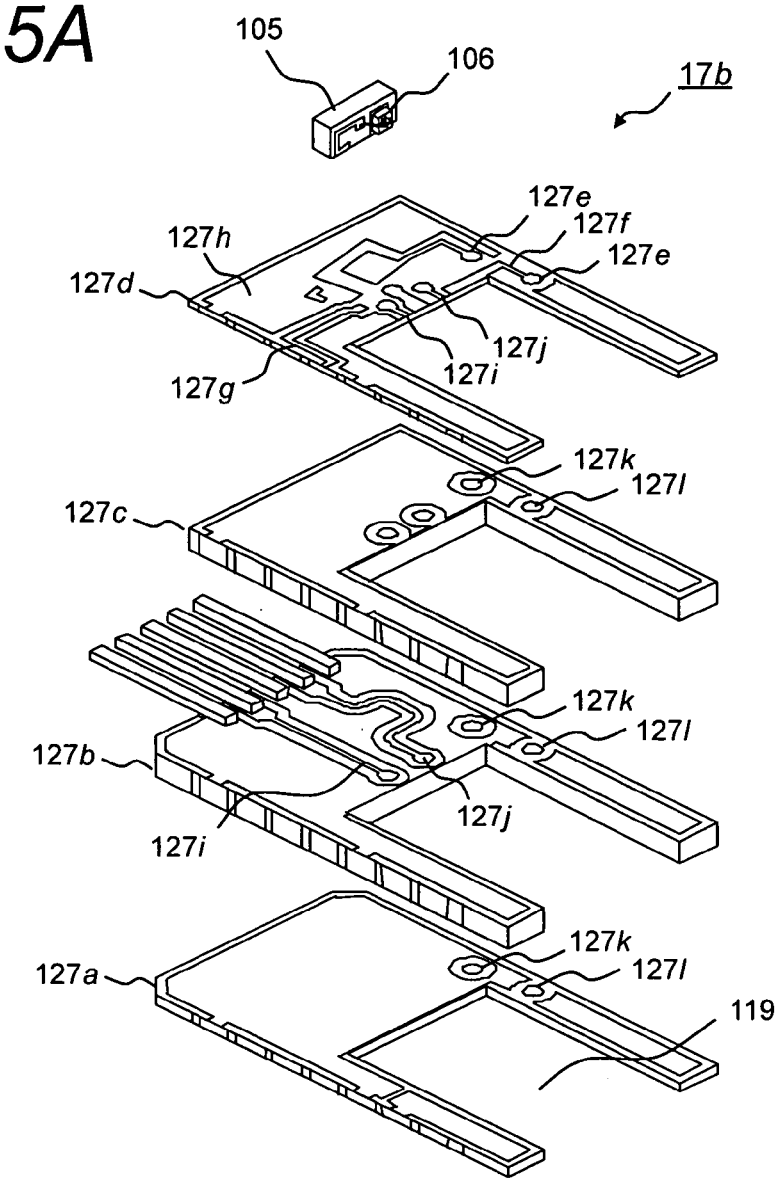
FIG. 5A is an exploded view of the second multi-layered ceramic substrate, and FIG. 5B magnified a semiconductor light-receiving device with a chip carrier mounting the light-receiving device thereon.

The first multi-layered ceramic substrate 17a arranges the second multi-layered ceramic substrate 17b thereon. FIG. 5A illustrates the structure of the second multi-layered ceramic substrate 17b. The second ceramic substrate 17b is also comprised of four sub-substrates (127a to 127d) each made of AlN or $Al_2O_3$ and provided with interconnections thereon. The bottom layer 127a and the top layer 127d have thickness thinner than those of the second and third layers, 127b and 127c. Each layer of the second ceramic substrate has, although the layers in the first ceramic substrate 17a have the opening in the center thereof, a pair of leg portions and a center portion connecting these leg portions to form a vacant region 119 leaving one side thereof open, faces the first wall 12a of the package 10. The reason for opening the one side is, since the second ceramic substrate 17b is mounted on the first ceramic substrate 17a, to secure an optical axis leading from the semiconductor light-emitting device 103 through the first lens 102 at the side of the first wall 12a. Moreover, widths of the third 127c and the topmost 127d layers along the direction that the leg portions extend are relatively shorter to those of the bottom 127a and the second 127b layers. Accordingly, when the top layer 127d arranges the side walls 12b to 12d thereon, an end portion of the second layer 127b may be exposed outside of the package 10.

Figure 6:
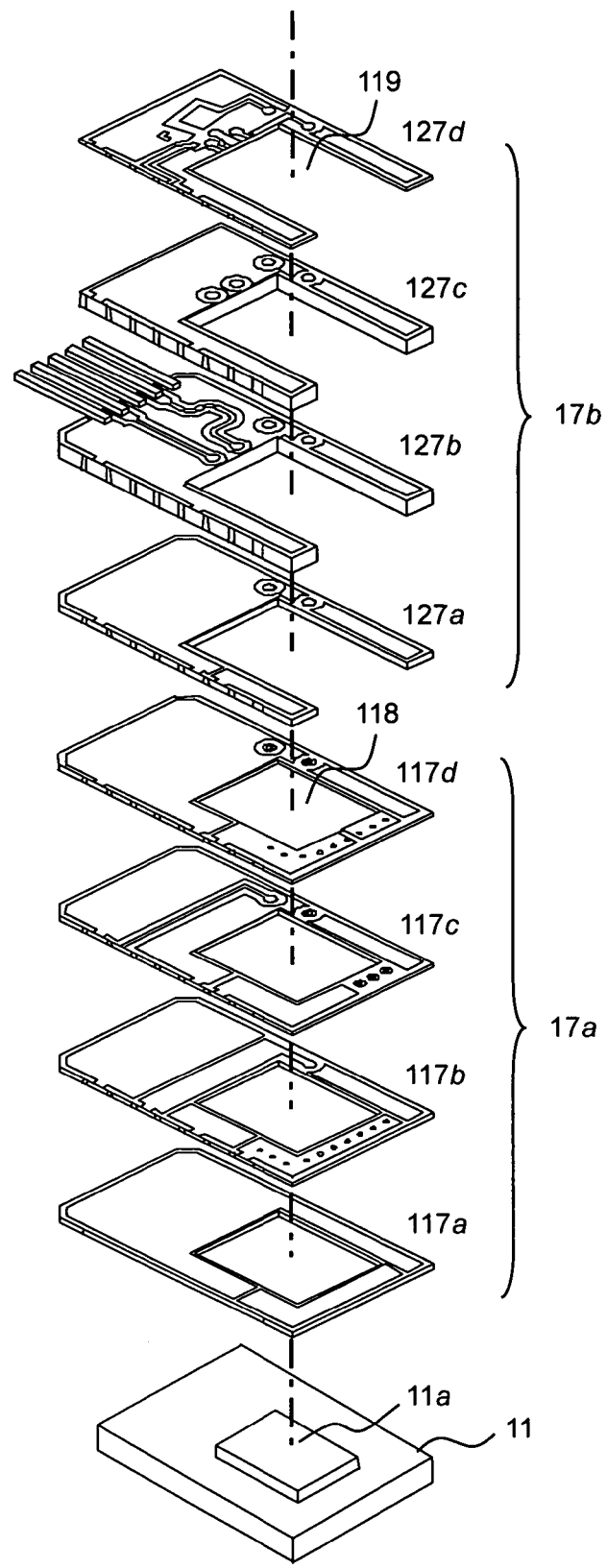
FIG. 6 illustrates the assembling of the first multi-layered ceramic substrate and the second multi-layered ceramic substrate.

FIG. 6 illustrates a relation of the stack of the bottom 11, the first multi-layered ceramic substrate 17a, and the second multi-layered ceramic substrate 17b. In the center portion of the bottom 11 is formed with the terrace 11a, and the opening 118 in respective layers (117a to 117d) in the first ceramic substrate 17a receives this terrace 11a. When the second ceramic substrate 17b is arranged on the first ceramic substrate 17a such that the vacant region 119 formed in respective layers (127a to 127d) in the second ceramic substrate 17b corresponds to the opening 118 in the first ceramic substrate 17a.

Figure 5B:
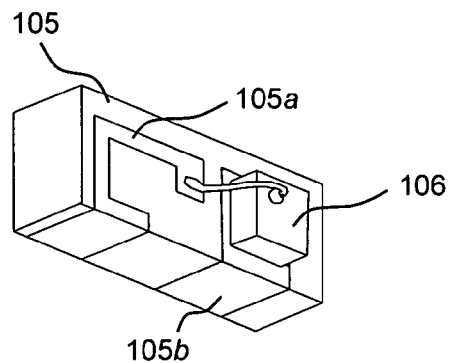

The top layer 127d of the second ceramic substrate 17b forms an interconnection 127e for a chip carrier 105, the light-receiving device 106 is to be mounted thereon, an interconnection 127f to power the light-emitting device 103, an interconnection 127g to extract a signal from the temperature sensor, and an interconnection to transmit the high-frequency signal to the light-emitting device 103 mounted on the carrier 52. That is, as illustrated in the magnified view of FIG. 5B, the light-receiving device 106 is mounted on the side of the chip carrier 105. On the side and the bottom of the chip carrier 105 is provided with interconnections 105a and 105b to transmit the signal from the light-receiving device 106. Wiring between the electrode of the light-receiving device 106 and the interconnection, and mounting the chip carrier 105 with the light-receiving device 106 on the top layer 127d of the second ceramic substrate 17b, the interconnections 105a and 105b on the chip carrier 105 are electrically connected with corresponding interconnections 127e and 127h on the top layer 127d. The interconnection on the chip carrier 105 is made of, for example Ni/Au, while the electrode of the light-receiving device 106 is made of eutectic metal involving gold such as AuSn. Mounting the light-receiving device 106 on the interconnection 105b and treating in thermal may die-bond the light-receiving device 106. Subsequently, placing the chip carrier 105 with the light-receiving device 106 on the interconnections, 127e and 127h, in the top layer 127d by interposing a metal pellet, typically AuSn soldering pellet, and carrying out the heat treatment, the chip carrier 105 is fixed on the interconnection 127e and 127d. The interconnection 127e is drawn out to the side portion of the top layer 127d, transmitted to the via hole 117k through the via hole 127k passing through all layers in the second ceramic substrate 17b, and finally reaches the lead pins 14b through the interconnection 117 in the first ceramic substrate 17a.

The interconnection 127f is to provide the DC current to the light-emitting device 103. As shown in FIG. 4, the DC current is provided from the lead pin 14b to the interconnection 127f on the top layer 127d through the interconnection 117g formed on the second layer 117b of the first ceramic substrate 17a, via hole 117l in the first ceramic substrate 17a and another via hole 127i passing all layers of the second ceramic substrate 17b. From the interconnection 127f to the device 103 is connected with the wire and the interconnection provided on the carrier 52. The top layer 127d also forms another interconnection 127g to transmit the signal from the temperature sensor mounted on the carrier 52 to the lead pin 14b. The bonding-wire connects the carrier 52 to the interconnection 127g, and this interconnection 127g is connected to the lead pin 14b arranged in the side wall 12b of the package 10.

The high-frequency modulation signal to the light-emitting device 103 is transmitted from the lead pin 14a to the interconnections, 127i and 127j, formed on the second layer 127b of the second ceramic substrate 17b. On the second ceramic substrate 127b, these interconnections 127i and 127j are surrounded by the ground line 127h, not only both sides thereof on the second layer 127b but also the ground planes in the first 127a and the third 127c layers. Thus, the interconnections, 127i and 127j, may configure a co-planar line capable of setting the transmission impedance to the prescribed value, which suppresses the degradation of the transmission signal. The interconnections, 127i and 127j, are brought to the top layer 127d by via holes 127d at the end portion of the second layer 127b, and, finally, connected the conducting patterns formed on the carrier 52. Thus, according to the present assembly, the top layer 127d of the second ceramic substrate mounts the light-receiving device 106, while the high-frequency modulation signal to the light-emitting device 103 is, input in the interconnection provided in the intermediate layer of the second ceramic substrate 17b, traveled below the light-receiving device 106, brought to the top layer 127d at the end portion of the second ceramic substrate 17b, and transmitted to the light-emitting device 103. Because the ground plane is interposed between the light-receiving device 106 and the interconnection for the high-frequency signal, the mounting of the light-receiving device 106 on the top layer may not affect the transmission impedance of the signal lines, 127*i* and 127*j*.

Only one of the signal line 127*j* has a curved pattern on the second layer 127*b*. This is why the terminating resistor corresponding to the signal line 127*j* positions in an edge portion on the carrier 52 compared with the other terminating resistor. Therefore, configuring only one of the interconnections to the curved shape may compensate this positional difference of the terminating resistor. The distance between the lead pin 14*a* to the terminating resistor becomes substantially equal to each other by configuring only one of the interconnection 127*j* to the curved pattern.

Next, the optical coupling efficiency between the light-emitting device 103 and the light-receiving device 106, and the monitored current of the light-receiving device 106 will be investigated. The optical coupling efficiency and the monitored current depend on the distance between two devices parallel to the optical axis connecting them. The coupling efficiency also depends on a deviation along the vertical and transverse directions within a plane normal to the optical axis. The position of the light-receiving device requires, in addition to secure a magnitude of the monitored photo current, that the change on the coupling efficiency deviation is suppressed to the positional deviation, that is, the light-receiving device 106 is necessary to be positioned in a region where the slope of the tolerance curve of the coupling efficiency is moderate. For the light-receiving device 106 according to the present invention shown in FIG. 5B, since the interconnections, 127*i* and 127*j*, pass below the light-receiving device 106, and expose at the edge portion of the top layer 127*d* for the first time. Accordingly, the light-receiving device 106 may position close enough to the light-emitting device 103. Further, the direction along the optical axis, X-direction, has an enough tolerance due to this up and down configuration of the interconnections and the light-receiving device 106. Only the vertical direction, Y-direction, has not an enough tolerance due to the structural limitation in the present assembly.

Figure 7A:
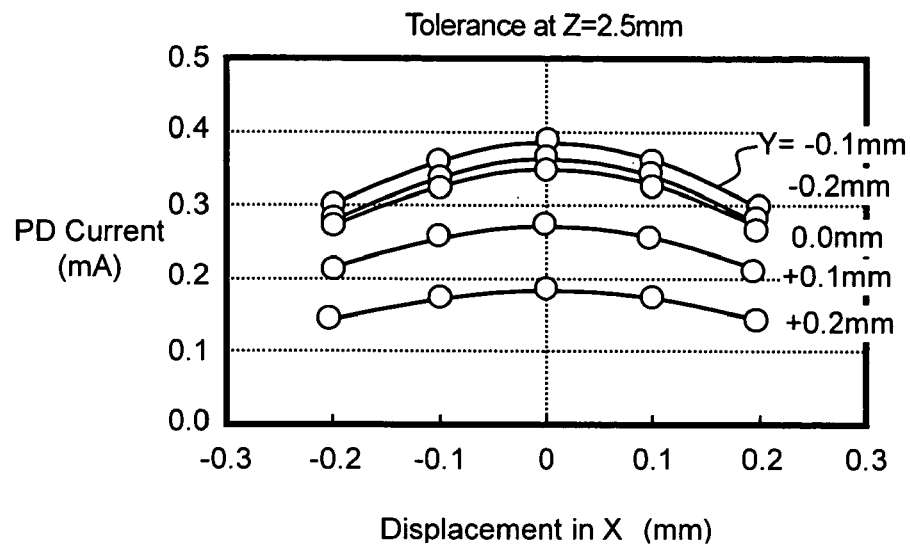
FIG. 7A shows an optical coupling characteristic between the light-receiving device and the EA-DFB device when the light-receiving device is installed in the preset position.
Figure 7B:
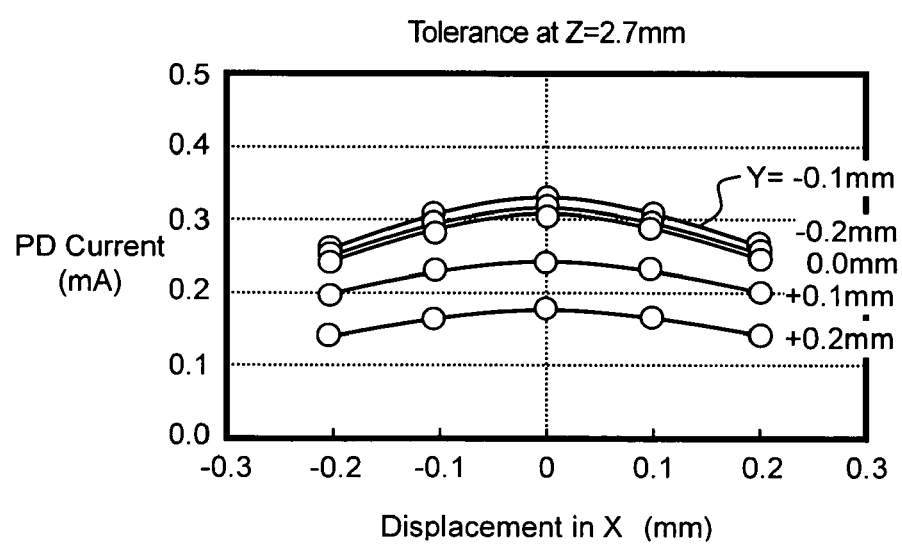
FIG. 7B shows a coupling characteristic when the light-receiving device is set behind the present position.

FIG. 7A and FIG. 7B show the optical coupling efficiency between the light-emitting device 103 and the light-receiving device 106. In the present assembly, the distance Z between these devices is set to 2.5 mm, and, for the vertical direction, the position +0.1 mm offset to the light-emitting device 103 is a standard for the light-receiving device 106. FIG. 7A illustrates the monitored current when the light-receiving device 106 is shifted in its vertical position within +/−0.2 mm from the standard position. The monitored current at least 0.1 mA can be obtained in all positions and, for the horizontal deviation, the change of the monitored current may be reduced. FIG. 7B is a result of the monitored current when the light-receiving device further shifts backward, apart from the light-emitting device. Though, the magnitude of the monitored current decreases compared with the case where the light-receiving device 106 is placed on the standard position shown in FIG. 7A, the current at least 0.1 mA may be still obtained and the variation thereof is still small.

Thus, the present assembly has a three dimensional arrangement of the interconnections 127*i* and 127*j* and the light-receiving device 106 so that the monitored current with enough magnitude and the enough alignment tolerance can be obtained.

Figure 3B:
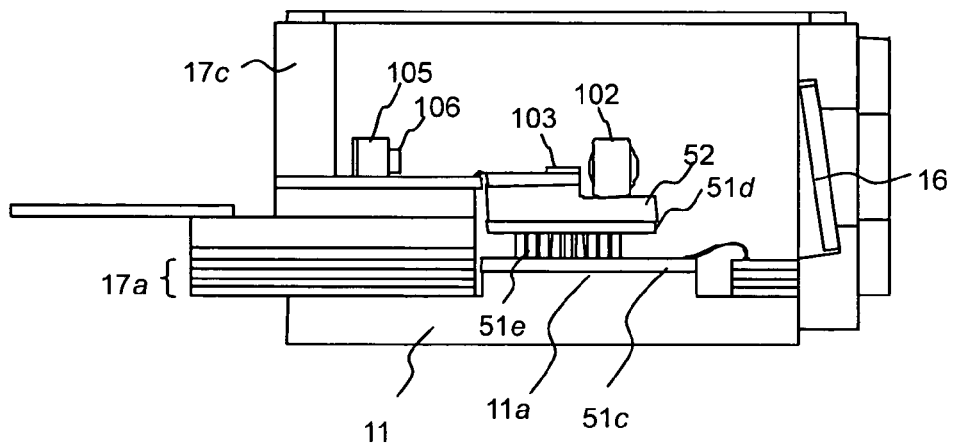
FIG. 3B is a side cross-section of the assembly.

Referring to FIG. 3 again, the top level of the second ceramic substrate 17*b* is lower than the top level of the carrier 52. This is owing to the light emitted from the light-emitting device 103 entering the light-receiving device 106 without being interrupted by the edge of the top layer 127*d*. Moreover, this configuration enables to make the length of the bonding wire connecting the interconnection on the top layer 127*d* to the wiring on the carrier 52 shortest. In the wire bonding, the bonding tool is necessary to be pulled up after the first bonding and before positioning to the second bonding point. To pull up the tool at the first point and, thereafter, to move it to the second bonding point increases the bonding strength. Accordingly, to set the level of the top layer 127*d* slightly lower than the level of the carrier 52 and to set the first point of the wire bonding is on the top layer 127*d* and the second point of the wire bonding is on the carrier 52, makes the wire length shortest keeping the bonding strength.

Moreover, the edge of the top layer 127*d* extrudes from those of lower layers from 117*a* to 117*d* and from 127*a* to 127*c* to make an overhang. The high-frequency signal transmitted in the second ceramic substrate 17*b* is carried to the wiring pattern on the carrier 52 by the bonding wire that connects the top layer 127*d* and the carrier 52. In transmitting the high-frequency signal, the length of the bonding wire should be as short as possible, so, the top layer 127*d* of the second ceramic substrate 17*b* is necessary to be put close enough to the carrier 52. The configuration mentioned above, between the top layer 127*d* and the carrier 52, enables to make the bonding wire shortest, which reduces the parasitic inductance of the bonding wire and suppresses the degradation of the quality of the high-frequency signal.

The upper plate 51*d* and the lower plate 51*c* of the thermoelectric cooler are made of insulating material such as $Al_2O_3$ or AlN. The bottom of the lower plate 51*c* is metallized with gold (Au) to be in contact with the bottom 11 by soldering or may be in contact with resin. The top surface of the upper plate 51*d* is also metallized with gold to solder to the bottom surface of the carrier, which may be similarly in contact with resin. Between the edge of the upper plate 51*d* and the edge of the lower plate 51*c* is provided with a gap to prevent the upper plate 51*d* from touching the ceramic substrate 17*a* when the bottom 11 mounts the thermoelectric cooler 51 thereon and the edge of the lower plate 51*d* touches the ceramic substrate 17*a*. Further, when soldering the upper plate 51*d* with the carrier 52, excess solder occasionally flows out to the peripheral of the upper plate 51*d*. To provide the gap between the upper plate 51*d* and the first ceramic substrate 17*a* prevents the excess solder flowing out from forming the solder bridge to be in contact with the first ceramic substrate 17*a*. Accordingly, the heat flow from the side of the first ceramic substrate 17*a* to the upper plate 51*d* may be reliably prohibited, thus the thermoelectric cooler 51 can be escaped from the excess thermal load.

Figure 8:
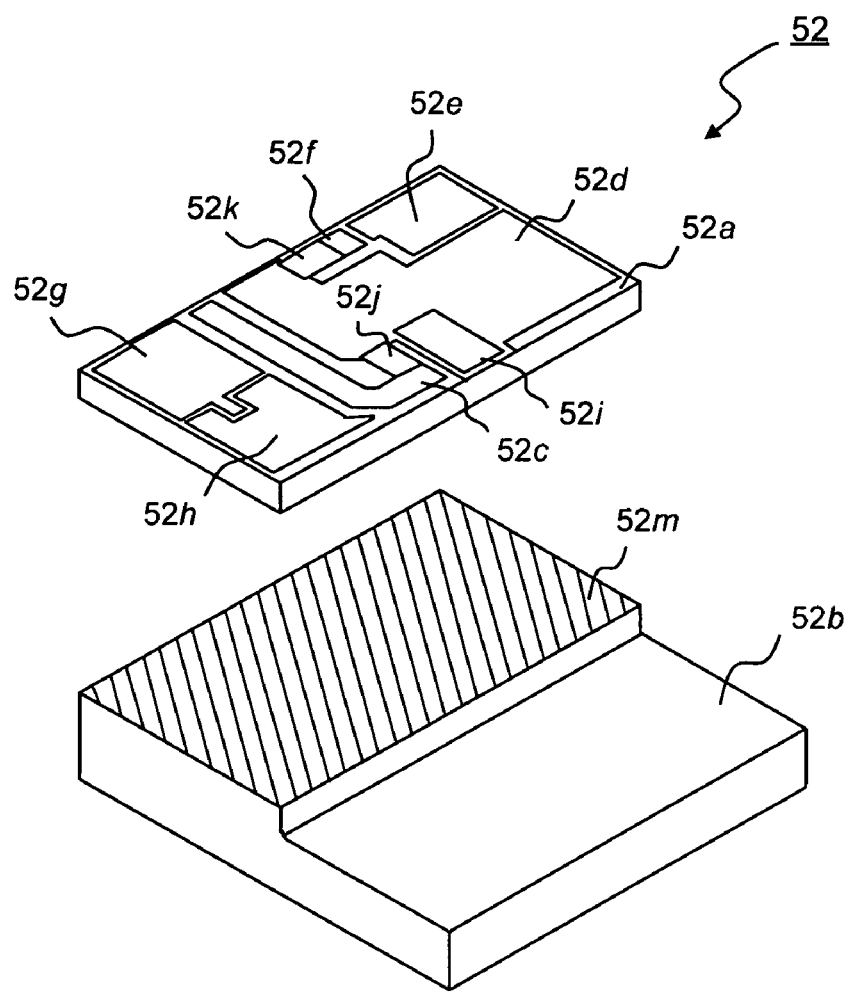
FIG. 8 is a perspective view of the carrier.

FIG. 8 illustrates the carrier 52. The carrier 52 is made of insulating material having good thermal conductivity, typically aluminum nitride (AlN). On the bottom of the carrier 52 is metallized with gold to solder to the top surface of the upper plate 51*d* of the thermoelectric cooler 51. The carrier 52 provides two mounting surfaces 52*a* and 52*b*, respectively, parallel to each other. The first mounting surface 52*a* forms various metallized patterns, and the second mounting surface 52*b* mounts the first lens 102 thereon. Although FIG. 8 illustrates that the surface layer and the inner layer are divided, these two layers are built with in one body in the practical carrier. The carrier providing such surface and inner layers may be formed by metallizing the wiring patterns on the surface layer first and machining the portion thereof to form the second mounting surface 52*b*. In one modification, laminating two insulating substrates may form the carrier 51. On the bottom of one substrate is formed in advance with a thin film of, for example, AuSn, AuGe and AuSi, while a portion of the second substrate forms the Au thin film, which has good wettability to those eutectic metal. Laminating these two substrates and alloying in the high-temperature furnace forms the integrated substrate. Since the eutectic metal and the gold metallized layer are used to the integrated substrate and the variation of the thickness of these metals are within sub-micron meter, the first and second mounting surface, 52a and 52b, may be formed in precise for the step therebetween.

Figure 9:
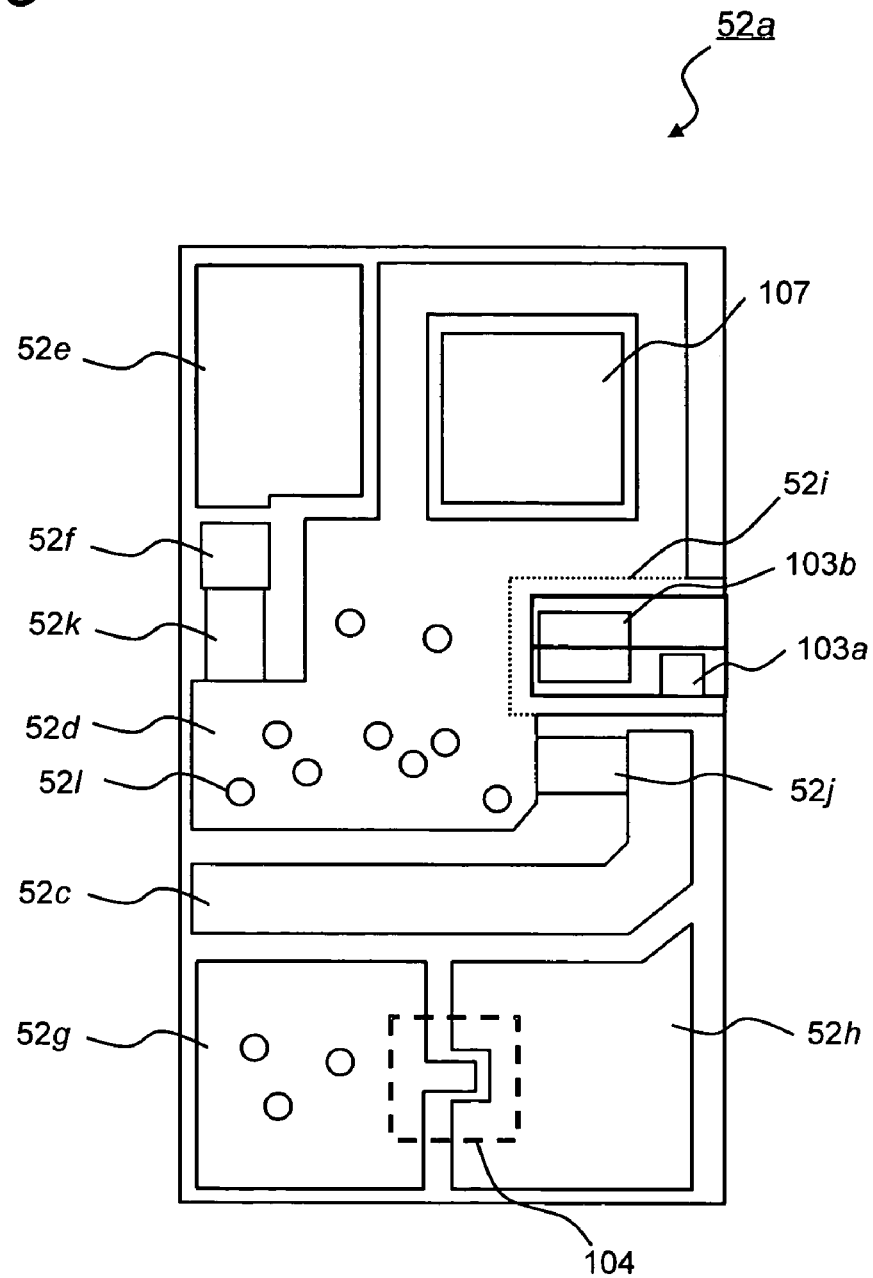
FIG. 9 is a plan view of the first mounting surface of the carrier.

The first mounting surface 52a of the carrier forms a plurality of wiring patterns (52c to 52i) and resistance patterns, 52j and 52k. Further, the light-emitting device 103, the temperature sensor 104, for example a thermistor, and a capacitor 107 are mounted. FIG. 9 is a plan view illustrating the wiring pattern and the elements mounted on the carrier 52. In the present assembly, the light-emitting device 103 integrates a distributed feedback (DFB) laser diode with an electro-absorption (EA) type semiconductor optical modulator, which is so called an is EA-DFB device. The gold (Au) covers the surface of the wiring pattern from 52c to 52i. Under the gold layer on the surface is formed with titanium (Ti) to enhance the adhesion to the AlN substrate. Between the titanium and the gold may be provided with a material to restrain the inter diffusion of the titanium and the gold. Total thickness of these metals is about 2 μm at most and the dispersion thereof is on the order of sub-micron meter. On the gold in the region 52i where the EA-DFB device 103 is mounted is provided with AuSn layer with a thickness of about 3 μm and a variation thereof is also on the order of sub-micron meter. Bottom of the EA-DFB device 103 forms a gold layer, therefore, by scrubbing the EA-DVB device 103 on the AuSn in the mounting region at around 300° C., the EA-DFB device 103 may be bonded in the region 52i. On the first mounting surface 52a is formed with ground patterns, 52d and 52g, and a transmission line 52c sandwiched by these ground patterns, 52d and 52g.

The carrier 52 has the inner ground 52m. This inner ground 52m is connected to the ground patterns, 52d and 52g, by a plurality of via holes 52l, which stabilizes the ground potential. When the ground potential is further stabilized, a plurality of inner grounds each connected by a plurality of via holes, may be formed. The ground pattern 52m, 52d, and 52g are connected to the lead pin 14a via the ground pattern in the second ceramic substrate 17b without being connected to the package ground, to which other metal parts and portions within the assembly, such as metallic members comprising the optical coupling portion 20 and the bottom 11 of the package 10 are connected. That is, the signal ground is electrically isolated from the package ground, which reduces the influence of the noise induced in the package ground to the high-frequency signal.

The transmission ling 52c on the first mounting surface 52a is surrounded by two ground patterns, 52d and 52g, in three directions in the mounting surface 52a and the inner ground 52m, which simulates the grounded co-planar configuration. The width of the transmission line 52c, and gaps to those ground patters are adjusted for the transmission line to show the predetermined transmission impedance. Generally, the output impedance of the driving circuit is set to be 50Ω, so the impedance of the transmission line is designed to become 50Ω.

The transmission line 52c forms a termination resistor 52i on the edge thereof so as to couple in parallel to the modulation part of the EA-DFB device. In the present embodiment, the termination resistor 52i is a metal thin film resistor made of $Ta_2N$ and NiCr. A chip resistor may be applied. In the present assembly 1, a pad 52f for a signal with a reverse phase is provided to assemble another termination resistor 52k between this pad for the reverse phase signal and the ground pattern 52d. Accordingly, a drive in a differential mode may be realized by providing the signal to the pad 52f reverse in the phase to the signal providing to the transmission line 52c. By the differential driving, not only the ground potential may be further stabilize, which enables to obtain an optical output with good quality, but also the EMI noise may be decreased. To compensate the unbalance in the distance of respective termination resistors, 52j and 52k, from the lead pins 14a, as aforementioned, one of the interconnection within the second layer 17b of the second ceramic substrate 17b, which is to be connected to the pad 52t, is formed in snaky.

The termination resistors, 52i and 52k, when the signal is applied to, become heating elements. Accordingly, it is preferable to mount the termination resistors apart from the EA-DFB device 103, although it is preferable to mount them close to the EA-DFB device from the viewpoint of the termination of the high-frequency signal. Therefore, the first termination resistor 52i of the transmission line for the high-frequency signal is arranged immediate to the EA-DFB device 103, while the other termination resistor 52k for the signal with the reverse phase is arranged close to the second ceramic substrate 17b on the top surface 52a of the carrier. In order to compensate the difference in the distance due to the arrangement of respective termination resistors, one of the interconnection, on which the signal with the reverse phase is transmitted, within the second ceramic substrate 17b is formed in snaky.

The transmission line 52c extends substantially in parallel to the optical axis of the EA-DFB device 103. As explained, on the top surface 127d of the second ceramic substrate 17b is provided with pads each connected, by bonding wires, to the transmission line 52c, ground patterns, 52d and 52g, on the first mounting surface 52a. These pads are connected to the lead pins 14a arranged in the side wall 12c of the package via interconnections formed on the top surface and within the inner layer of the second ceramic substrate 17b. By arranging all lead pins 14a for the high-frequency signal in the side wall 12c of the package 10, the driving circuit arranged outside of the package 10 may connect with the EA-DFB device 103 within the package 10 in the shortest distance.

In a driving method for the EA-DFB device 103 with a single-phase signal, the potential of the ground patterns, 52d and 52g fluctuates with this single-phase signal. To guide the reverse-phase signal into the carrier 52 may compensate or may reduce this fluctuation of the ground potential. Accordingly, the ground for the EA-DFB device 103 can be also stabilized, which suppresses the overshoot or undershoot on the driving signal.

Figure 10:
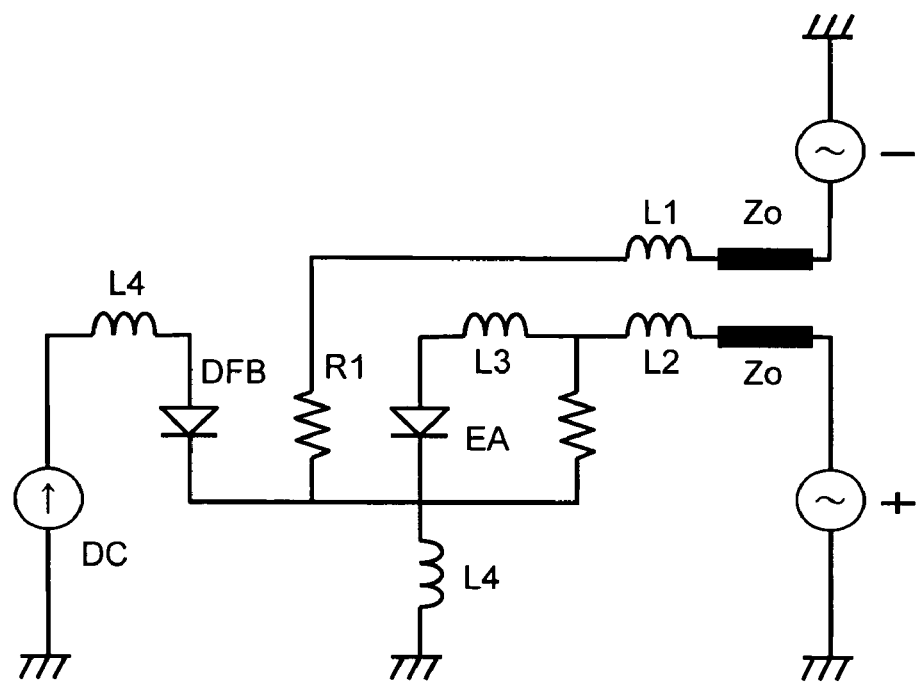
FIG. 10 is an equivalent circuit of the EA-DFB device and the carrier.

FIG. 10 illustrates an equivalent circuit diagram that simulates the electrical characteristics around the EA-DFB device 103 when the differential signal is led into the carrier. The signal with the normal or the reverse phase is transmitted on the second ceramic substrate 17b with transmission impedance $Z_0$ and is provided to the respective transmission lines, 52c and 52f on the carrier 52 by bonding wires. In FIG. 10, inductors, L1 and L2, denote the parasitic inductance attributed to the bonding wire connecting the second ceramic substrate 17b with the carrier 52. The signal with the reverse phase is guided to the ground 52d via the termination resistor 52k, while the signal with the normal phase is guided to the ground 52d via the termination resistor 52k arranged immediate to the EA-DFB device. On the same time, the signal with the normal phase is supplied to the electrode 103a for the modulating part of EA-DFB device 103 with the bonding wire L3.

For the DFB-LD, which is driven by the DC signal, the bias current is supplied to the electrode 103b of the DFB-LD from the upper electrode of the capacitor 107 via the bonding wire IA. The supplied current, passing through the DFB-LD, is sunk in the ground 52d via the back electrode of the DFB-LD. The ground 52d is connected to the signal ground 52m formed in inner of the carrier 52 through via holes 52l. In FIG. 10, the inductor L4 denotes the parasitic inductance attributed to these via holes 52l.

As shown in FIG. 10, this parasitic inductance L4 due to the via holes 52l is connected as a common impedance for the resistance, the modulation device, and the DFB-LD device. Therefore, when the high-frequency signal drives the modulation device, this high-frequency signal directly affects the resistor and the DFB device. By providing the signal with the reverse phase into the carrier 52, this fluctuation of the ground potential may be compensated. Further, to guide two signals with the normal and the reverse phase brings additional function to reduce the EMI noise radiated from the assembly, which prevent the electronic parts arranged peripheral of the assembly 1 such as the light-receiving assembly from malfunctioning.

It may be effective to connect a capacitor in parallel to the termination resistor R1 for the signal with the reverse phase to maintain a symmetrical condition to the signal with the normal phase. The equivalent circuit for the normal phase signal is the termination resistor 52i connected in parallel to the modulation device 103a. The equivalent circuit of the modulation part 103a may be denoted as a resistor and a capacitor connected in parallel to each other. The capacitor is the junction capacitance of the p-n junction and the resistor has the resistance when this p-n junction is biased in reverse. Generally, when the p-n junction, i.e. a diode is biased in reverse, the resistance thereof becomes enough large, While the resistance of the termination resistor is 50Ω. Accordingly, in the circuit of the modulation device 103a and the termination resistor 52i connected in parallel to each other, the resistance when the diode is biased in reverse may be compensated by the termination resistor 52i and only the junction capacitance of the diode is left as a substantial element for the circuit operation. To connect the capacitor having substantially same capacitance with the junction capacitance in parallel to the termination resistor 52k enhances the symmetry between the transmission paths for the normal phase signal and the reverse phase signal. The capacitor to be connected in parallel to the termination resistor may be a dummy modulation device.

However, the present invention is not limited to the differential mode driving, the driving by the single phase signal may be applicable depending on the optical output quality to be required and the level of the radiation noise.

Referring to FIG. 3 again, the second mounting surface 52b of the carrier 52 assembles a lens 102 made of glass. In the present invention, the lens 102 is directly adhered to the second mounting surface 52a without providing any lens holder. The lens 102, which is a non-spherical lens and formed by the glass molding, has a surface 102a made of also glass molding. In one modification, the machining of a cylindrical lens formed by the glass molding may form the surface 102a. Thus explained method for forming the lens 102 realizes the accuracy of the level of the surface 102a and the optical axis of the lens 102 within +/−3 μm to +/−5 μm. The adhesive may be an adhesive curable with ultraviolet light. By selecting the adhesive with suitable viscosity, the thickness of the adhesive between the surface 102a and the second mounting surface 52b may be controlled within a few micron meters. In this arrangement, since the lens holder may be omitted, not only the total height of the assembly may be shrunk but also the heat capacity thereof may be reduced, which results in the power-saved thermoelectric cooler. A spherical lens, instead of the non-spherical lens, may be applicable, and even in this case, the spherical lens preferably provides the mounting surface 102a.

The step between the first and the second mounting surfaces, 52a and 52b, of the carrier 52 may be realized in its accuracy from +/−5 μm to +/−10 μm. The AuSn layer formed on the first mounting surface 52a is mediated between the mounting surface 52a and the EA-DFB device, the dispersion of the thickness of the AuSn layer and that of the Ni thereunder are quite small. Further, the thickness of the EA-DFB device may be controlled within +/−5 μm to +/−15 μm. Accordingly, in the present arrangement that the first mounting surface 52a assembles the EA-DFB device 103 thereon while the second mounting surface 52b mounts the lens 102, the mismatch in respective optical axes becomes around 20 μm at most and the loss due to this mismatch of the optical axis may be suppressed within 0.3 dB.

Moreover, metal parts mounted on the thermoelectric cooler 51 are limited to those metal thin films of interconnection patterns formed on the surface and within the inner of the carrier 51 and metal electrodes of the EA-DFB device, the capacitor 107 and the thermistor 104, and no bulky members. The volume, accordingly the heat capacity, of parts mounted on the thermoelectric cooler 51 can be reduced, which enables the cooler 51 to reduce its heat/cool capability. The table below lists the specific heat, the specific gravity, and the heat capacity of various members used in the optical assembly. The heat capacity is a product of the specific heat and the specific gravity.

TABLE

Physical properties of various materials

| Material | Specific Heat [J/g/K] | Specific gravity [g/mm$^3$] | Heat capacity [mJ/K/mm$^3$] |
|---|---|---|---|
| CuW(Cu 10%) | 0.163 | 0.0170 | 2.78 |
| Stainless steal | 0.460 | 0.0077 | 3.54 |
| Kovar$^M$ | 0.439 | 0.0084 | 3.67 |
| Glass | 0.498 | 0.0037 | 1.84 |
| AlN | 0.670 | 0.0033 | 2.18 |
| SiC | 0.728 | 0.0032 | 2.33 |

In the present assembly 1, (1) The light-receiving device 106 and the chip carrier 105 are arranged outside of the carrier 52, namely, not mounted on the thermoelectric cooler 51;

(2) The carrier 52 is made of aluminum nitride (AlN) and does not install metal members except thin films; and (3) The lens 102 directly adheres to the carrier 52 with the adhesive, which enables to exclude any metal members and to reduce the volume. Consequently, the heat capacity of the carrier 52 remarkably reduces from 311.8 [mJ/C] to 11.9 [mJ/C] as it mounts parts such as EA-DFB device 103. Assuming the case that the assembly 1 starts its operating at the ambient temperature 70° C. and controls the surface temperature of the carrier 52, which is monitored by the thermistor 104, to be 30° C. and the allowed time to get the steady temperature condition is 30 seconds at most, the present assembly 1 or the arrangement of the present carrier 52 requests the cooling ability of only 16 mW for the thermoelectric cooler. In this case, the heat generation of the EA-DFB device 103 by turning on the device is ignored. When the similar situation is assumed for the conventional assembly, the cooling ability of 416 mW is necessary.

The carrier provides the ground pattern 52m in the inner layer thereof, and the transmission line 52c for the signal arranges immediate to the EA-DFB device 103. The high-frequency signal is supplied to the EA-DFB device via this transmission line 52c, which reduces the parasitic inductance attributed to the bonding wire, thus the degradation of the high frequency signal is suppressed and the superior high frequency performance may be obtained.

In the embodiment above explained, the transmitting assembly includes the EA-DFB device 103. However, the present invention may be applicable to assemblies that provides devices not including the modulating portion, such as DFB-LD and FP-LD (Fabry-Perot Laser Diode), and directly modulates these devices. In such case using the DFB-LD and the FP-LD, it is preferable to provide a resistor in series to the transmission line 52c to compensate the impedance of these devices.

Figure 11:
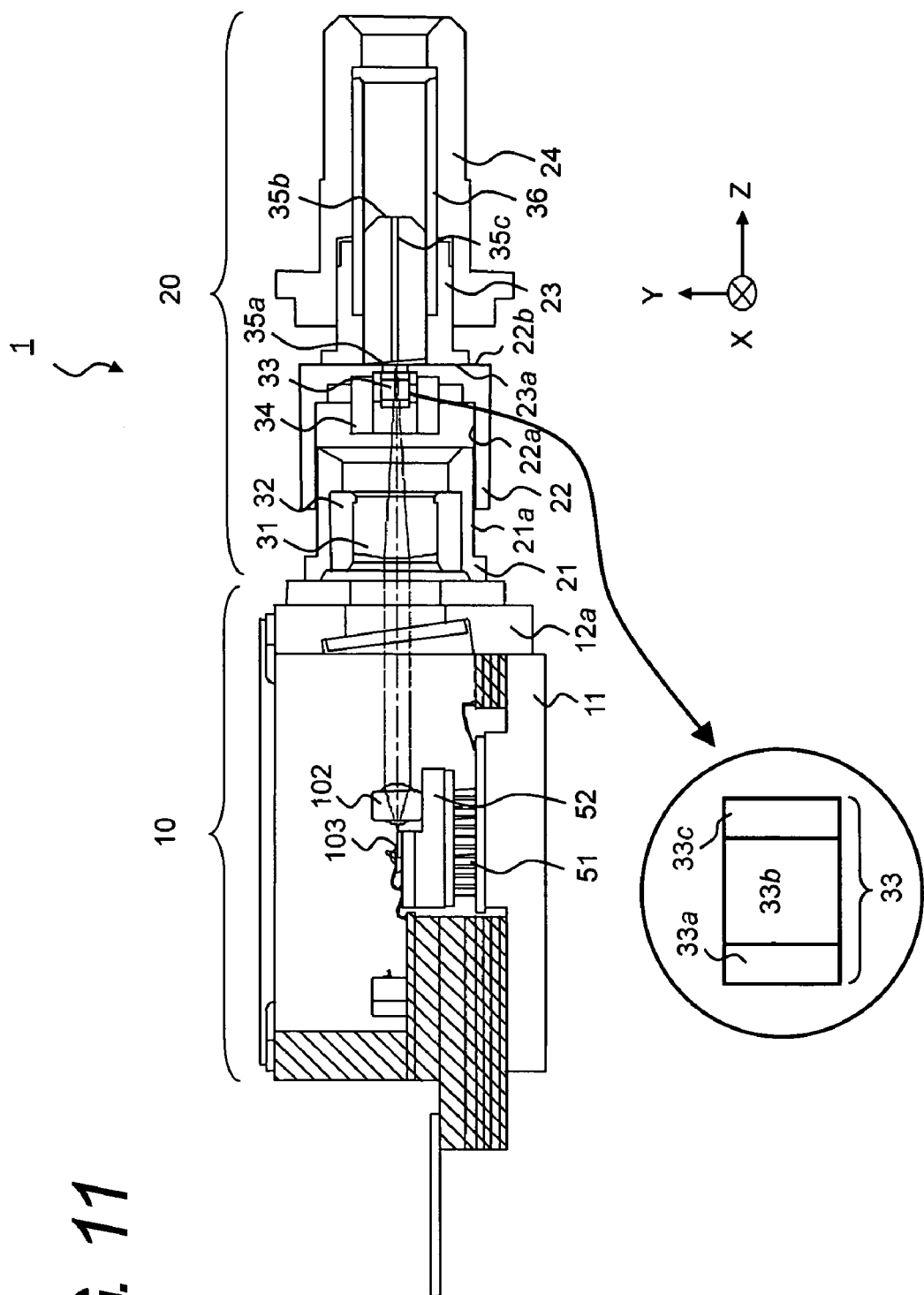
FIG. 11 is a side cross section illustrating the coupling between the package and the optical coupling portion.

Next, the optical coupling portion 20 will be described as referring to FIG. 11. The optical coupling portion 20, attached to the first side wall 12a of the package 10, comprises a lens holder 32, the first cylindrical member 21, the second cylindrical member 22, the third cylindrical member 23, and the fourth cylindrical member 24 from the side of the package 10. The first cylindrical member 21 secures the second lens in arranged in the lens holder 32. The second cylindrical member 22 secures the optical isolator 33 and the magnet 34. The optical isolator combines optical polarizer, 33a and 33c, and a rotator 33b. The third cylindrical member 23 and a portion of the fourth cylindrical member 24 secure the sleeve 36 therein, and the sleeve 36 secures the stub 35 therein with the third cylindrical member 23.

Between the inner surface of the side 22a of the second cylindrical member 22 and the outer surface of the side 21a of the first cylindrical member 21a is provided with a minute clearance therebetween (10 to 50 μm). Accordingly, the second cylindrical member 22 is able to slide along the optical axis, which is denoted as the Z-direction in FIG. 1, thereby enabling the optical alignment along the optical axis. On the other hand, the end surface 23a of the third cylindrical member 23 is able to slide on the end surface 22b of the second cylindrical member 22. It enables to align in the XY-plane between the coupling fiber secured in the center of the stub 35 and the second lens 31. Between the first and the second cylindrical members, 21 and 22, and between the second and the third cylindrical members, 22 and 23, are to be welded by the YAG laser after the alignment. The first lens 102 converts the light emitted from the EA-DFB device to a substantially parallel beam. This parallel beam is converged and focused, by the second lens 31, on the coupling fiber secured in the center of the stub 35 after passing through the optical isolator 33. These arrangements realize the optical coupling efficiency of about −2.0 dB.

The coupling fiber 35c is secured in the center of the stub 35 made of zirconia ceramic. One end 35a of the stub 35 is inclined by 5° to 8° against the optical axis, on the other hand, the other end 35b of the stub is processed in spherical with a diameter thereof from 10 mm to 25 mm. The sleeve 36 is a rigid sleeve, the root portion of which receives the stub 35. The ferrule, which is attached to the optical connector and not illustrated in FIG. 11, is inserted from the opening of the sleeve 34 to butt the distal end thereof to the other surface 35b of the stub 35, thus realizes the physical contact between the ferrule and the stub 35. The sleeve may be a split sleeve instead of the rigid sleeve. The inclined surface 35a of the stub 35 to the optical axis and the physical contact of the other surface 35b to the ferrule suppress the Fresnel reflection of the light emitted from the EA-DFB device 103 at the interface between members in the optical coupling portion 20. Moreover, depending on the isolation performance of the isolator 33 and the tolerance of the EA-DFB device 103 to the reflected light, the stub 35 may be omitted.

(Manufacturing Method)

Next, a method for manufacturing the optical assembly and a method for testing the optical assembly of the present invention will be described. FIG. 12 illustrates a process for assembling parts on the carrier 52.

Figure 12A:
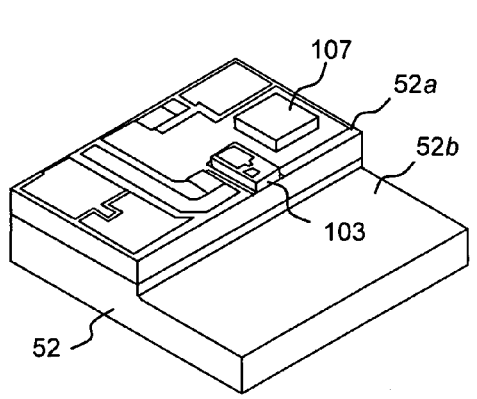

First, the EA-DFB device 103 and the capacitor 107 are mounted on the first mounting surface 52a of the carrier. The EA-DFB device 103 is die-bonded onto the AuSn layer formed on the metal pattern 52d on the carrier in advance. The capacitor 107 may be die-bonded by the similar method to the EA-DFB device 103 or may be attached by using an AuSn pellet (FIG. 12A).

Figure 12B:
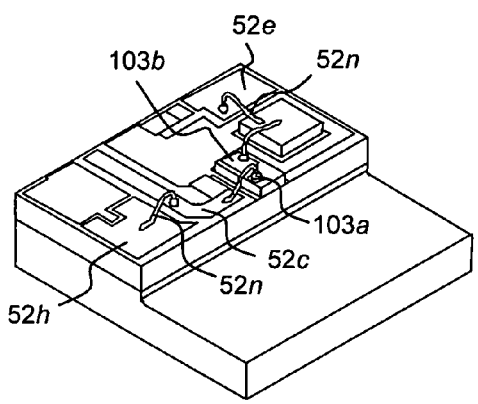

Next, respective bonding wires 52n connect the upper electrode 103a of the EA portion of the EA-DFB device 103 to the transmission line 52c, the upper electrode 103b of the DFB portion to the upper electrode of the capacitor 107, this upper electrode of the capacitor to the pad 52e, and the transmission line 52c to the other pad 52h, as illustrated in FIG. 12B.

Figure 12C:
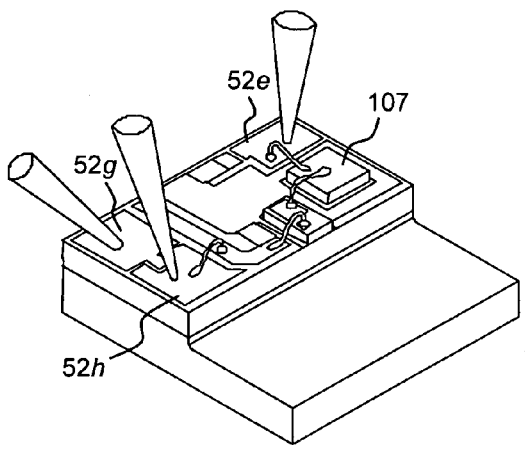

At this process, the EA-DFB device 103 is operable between the first pad 52e and the second pad 52h. Therefore, probing the first and second pads, 52e and 52h, and the ground pad 52g, supplies the bias voltage to the EA portion 103a while the bias current to the DFB portion 102b, which practically makes the EA-DFB device 103 emit light. Thus, the testing whether a predetermined optical output against the supplied current and the voltage is carried out by monitoring the optical output from the EA-DFB device 103, as shown in FIG. 12C.

Figure 12D:
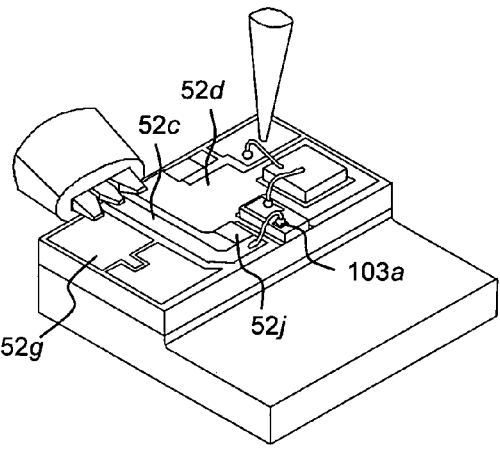

Next, the static burn-in testing carries out. That is, the device is kept at a temperature, for instance 85° C., and a long time, for instance 48 hours, as probing respective pads, 52e, 52h, and 52g, and supplying the electrical power to the EA-DFB device 103, similar to the static testing mentioned above. Comparing the optical characteristics against the supplied current and voltage before and after the burn-in, the device is decided to make the initial failure when the change is greater than the predetermined standard. After the burn-in testing, removing the bonding wire between the transmission line 52c and the second pad 52h, which is wired at the process illustrated in FIG. 12B, and the microwave probe 52c provides the high frequency signal to the EA-DFB device 103 by making the probe in contact to the end of the transmission line 52c and the ground pads, 52d and 52g, arranged both sides of the transmission line 52c. In this process, the other probe for low frequencies makes in contact to the first pad 52e to provide the electrical power to the EA-DFB device 103. This probing enables the dynamic testing by monitoring the optical waveform output from the EA-DFB device 103 to decide the quality thereof, as illustrated in FIG. 12D.

Thus, the present method enables to test the EA-DFB device 103 in both the low and high frequencies before the carrier is installed in the package 10. Moreover, it is unnecessary in the present method to solder to the carrier to the fixture for the testing and to remove the solder after testing, which reduces the testing cost.

The microwave probe used in the dynamic testing mentioned above is configured to provide terminals for the high frequency signal sandwiched by two ground terminals in order to maintain the predetermined impedance to the tip of the terminals. By making these terminals in contact to corresponding pads formed in the end of the transmission line 52c and two ground patterns, 52d and 52g, adjacent thereto, the loss of the high frequency signal may be minimized and the degradation of the waveform may be reduced. For the DC testing and the DC burn-in testing, only the DC signal or the signal with low frequencies is applied to the EA-DFB device, accordingly, pads, 52e and 52h, with wider area may be used.

Figure 12E:
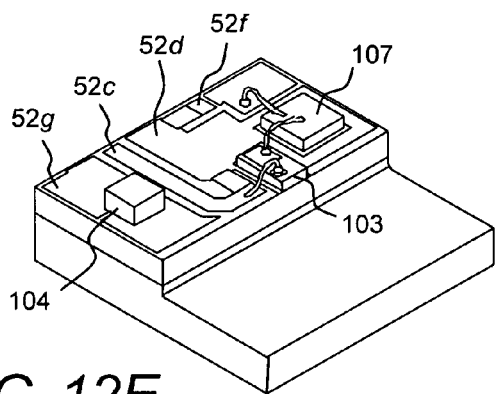

Subsequently to the high frequency testing mentioned above, the non-defective carrier 52 passing those testing mounts the thermistor between the pad 52h and the ground pad 52g, as illustrated in FIG. 12E. Accordingly, the lower electrode of the thermistor short-circuits these pads, 52h and 52g, to function the pad 52h as the ground pattern. Thus, the ground pattern may extend immediate to the EA-DFB device 103, which forms the impedance matched transmission line close to the EA-DFB device 103, and what is more, the carrier 52 may be compact because the pad 52h for the probing diverts to the ground pattern.

Subsequently, the carrier 52 mounting the EA-DFB device 103 is installed on the upper plate 51d of the thermoelectric cooler 51, and the assembly of the carrier 52 with the thermoelectric cooler 51 is mounted on the terrace 11a provided on the bottom 11 of the package 10. These mounting, the carrier on the upper plate 51d and the assembly on the terrace 11a, are carried out by soldering. Next, the wire-bonding is performed between first and second electrodes, 51a and 51b, on the lower plate 51c of the thermoelectric cooler 51 and first and second electrodes, 17d and 17e, formed on the top layer 117d of the first ceramic substrate, and between the transmission line 52c, and ground patterns, 52d and 52g, these are formed on the carrier 52, the upper electrode of the thermistor 104 and corresponding pads formed on the top layer 127d of the second ceramic substrate 17b.

In the present assembly 1, the bonding wires to the transmission line 52c, to the ground patterns, 52d and 52g, and other bonding wires that transmit the bias supply and the signal with the low frequency extend along substantially parallel to the optical axis of the EA-DFB device 103. In the wire bonding, the tool called as the capillary supplies the bonding wire from the tip thereof, and presses the wire to the bonding area with the tip of the capillary as impressing the ultrasonic wave thereto or heating there, thus performs the wire bonding. Therefore, enough space capable of approaching the capillary has to be secured around the bonding area. Accordingly, the bonding area may not be brought close to the side wall.

In the present assembly 1, aligning the direction of the bonding wire substantially parallel to the optical axis becomes effective to narrow the width of the package 10. The recent standard for the optical transceiver, because of the requirement for mounting the transceiver with high density, rules the severe restriction in the width thereof. The present arrangement of the optical assembly satisfies such new severe standard. Although two bonding wires from the top surface of the EA-DFB device 103 extends to a direction substantially normal to the optical axis, these bonding wires are wire-bonded before installing the carrier 52 within the package 10, accordingly, it does not become the restriction for the width.

Subsequent to the wire bonding, the first lens 102 is fixed and the ceiling 13 seals the package with the seal ring 13a. Finally, the optical coupling portion attaches to the package 10. This attachment will be described as referring to FIG. 11. First, the first cylindrical member 21, in which the lens 31 is secured, is welded with the first side wall 12a of the package by the YAG-laser. Next, the optical alignment between the first cylindrical member 21 and the second cylindrical member 22 along the Z-axis and between the second cylindrical member 22 and the third cylindrical member 23 in the plane perpendicular to the optical axis are carried out as, inserting the optical connector providing the ferrule on the distal end thereof into the sleeve 36, the EA-DFB device 103 being practically powered and monitoring the optical power through the optical fiber connected to the ferrule. After the optical alignment, these cylindrical members are welded to each other by the YAG-laser. The EA-DFB device 103 is installed in the package 10 as the carrier 52 mounts the device 103 thereon and the bonding wires are connected to respective devices, the EA-DFB device 103 may be powered by supplying the bias current from the lead pin 14b.

Specifically, the fourth cylindrical member 24, the first cylindrical member 21, and the second cylindrical member 22 are aligned in three directions (XYZ) as the EA-DFB device 103 is powered on. That is, in the first; as monitoring the optical power of the light propagating in the optical fiber, the first cylindrical member 21 is positioned and fixed to the first side wall 12a of the package 10 so as to obtain a predetermined output power. Next, the second cylindrical member is aligned with the first cylindrical member along the Z-axis to obtain a predetermined output power, and fixed by the YAG-laser welding. Finally, the fourth cylindrical member 24 is aligned in the XY-plane, and the YAG-laser welds the second cylindrical member 22 with the third cylindrical member 23. Moreover, in this three directional alignment, by coinciding the polarization direction of the optical isolator with the direction of the end surface 35a of the stub 35, which is inclined to the optical axis, the rotational alignment of the cylindrical member becomes unnecessary, which saves the alignment work without degrading the optical coupling efficiency.

FIG. 13 illustrates a cutaway view of an optical transceiver 9 that installs the present optical transmitting assembly 1. The optical transceiver 9 comprises the optical transmitting assembly 1, an optical receiving assembly 2, a lower frame 3, and a substrate 4. Although not illustrated in FIG. 13, the optical transceiver 9 further, in addition to those parts mentioned above, comprises an upper frame to form, accompanied with a lower frame, a cavity where two assemblies, 1 and 2, and the substrate 4 are installed therein. The lower frame 3 includes an optical receptacle mounting portion 3a, an assembly-mounting portion 3b, a substrate-mounting portion 3c, and a plug-receiving portion 3d. The tip ends of respective assemblies, 1 and 2, protrude into the receptacle-mounting portion 3a to mate the coupling portion 20 with the ferrule attached to the optical connector 6 inserted from the opening 3a of the receptacle, thus realizing the optical coupling therebetween. In the present optical transceiver 9, the optical transmitting assembly 1 has a box-shaped package 10, while the optical receiving assembly 2 has a co-axial package, the shape of which is just extending the coupling portion.

On the rear of the optical assemblies, 1 and 2, installs the substrate 4, which includes three portions, 4a to 4c. The first portion 4c extends from the second portion 4c, passing the side of the transmitting assembly 1, to the rear end of the receiving assembly 2. This arrangement of the substrate 4 is to suppress the degradation of the high frequency performance of the optical transceiver 9 by extending the substrate 4 to the rear end of the receiving assembly and by drawing the impedance-matched interconnection on the substrate, because the thermoelectric cooler is unnecessary in the receiving assembly that enables to use the small sized co-axial package.

On the other hand, for the transmitting assembly 1, the lead pin for the high frequency signal extrudes from the rear side wall and connects with the transmission line provided on the substrate just front of this side wall. The substrate 4 configures to shorten the lead pin, which is unable to match the impedance, as possible for either assembly. Moreover, for the transmitting assembly 1, the substrate 4 installs the driver 5 for driving the EA-DFB device 103 just behind the lead pin for the high frequency signal.

From the arrangement of the interconnection within the package 10 and the position of the driver 5, the high frequency signal transmits on a substantially liner line from the driver 5 to the EA-DFB device 103, which prevent the loss and the unnecessary reflection of the high frequency signal. Moreover, an electronic circuit for the transmitting assembly is installed on a first surface, illustrated in the figure, of the substrate 4, while an circuit for the receiving assembly is installed on a second surface, and between the first and second surfaces of the substrate 4 is provides with a low impedance line, such as the ground line and the powered line.

Thus, the substrate 4 secures the electrical isolation between the first and second surfaces. In the fourth portion 4d of the substrate 4, namely, the rear end of the substrate provides wiring patterns, not illustrated in the figure, for the electrical plug. By mating this electrical plug with the connector of the motherboard, where the transceiver is to be mounted, the control circuit provided on the motherboard may communicate with the transceiver 9. Generally, the motherboard installs a plurality of cages that receives the transceiver 9. Thus, the optical transceivers with the pluggable function, namely, inserting the transceiver 9 into the cage and mating the plug with the connector, can be realized.

The transmitting assembly of the present invention, and the method for manufacturing the assembly are thus described as referring to accompanying drawings. However, the present invention is not restricted to those illustrated in figures. For example, embodiments consistently use the semiconductor device integrated the semiconductor laser with the semiconductor optical modulator and the electrode common to two devices faces the carrier, but another configuration that respective electrodes inherently to two devices face the carrier may be applicable.

FIG. 14A is a plan view of the first mounting surface 52a of the carrier 52 for the semiconductor device 103 having such configuration mentioned above. In the present embodiment, a pad 52e for supplying the bias current to the semiconductor laser extends to the device and bonds the electrode 103b of the laser portion, while the transmission line 52c bonds the electrode 103a of the modulation portion. By wire-bonding the second pad 52e with the transmission line 52c and the common electrode, i.e. the upper electrode, of the semiconductor device 103 with the ground pattern 52d, not only the semiconductor device is supplied with the bias current but also, simultaneously, the semiconductor device 103 may be tested in primary by applying the low frequency signal to the second pad 52h. Further, by removing the bonding wire between the second pad 52h and the transmission line 52c, the dynamic testing of the device 103 may be carrier out by applying the high frequency signal between the transmission line 52c and ground lines, 52d and 52g.

Moreover, the present invention may be applied for the semiconductor laser diode not integrated with the modulation device. FIG. 14B is a plan view where the semiconductor laser 203 is mounted on the carrier 52. The laser 203, because the internal resistance thereof is so small, typically a few ohm, the termination resistor 52j, resistance of which is scores of ohms, is inserted in serial to the transmission line 52c to match the impedance of the transmission line to 50Ω. The wire bonding connects the upper electrode of the semiconductor laser 203 with the transmission line just behind the termination resistor, while the lower electrode of the laser 203 bonds directly to the signal ground 52d. The wiring between the transmission line 52c with the second pad 52h enables the static testing by supplying the bias current from the second pad 52h to the semiconductor laser 203. After the testing and by removing the this between the transmission line 52c and the second pad 52h, the dynamic testing can be carried out by supplying the high frequency signal to the signal line 52c and the signal grounds, 52d and 52g, sandwiching the signal line 52c.

FIG. 14B illustrates the case when the semiconductor laser 203 is driven by the single phase signal. FIG. 14C illustrates the case when the laser 203 is driven by the differential signals. The transmission line 52c supplies the signal with the normal phase, while the transmission line 52f supplies the other signal with the reverse phase, to the semiconductor laser 203. Both of transmission lines, 52c and 52f, provide termination resistors, 52j and 52k, respectively, having the resistance of scores of ohms, which is similar to those illustrated in FIG. 14B. The laser 203 is mounted on the transmission line 52f to bond the back electrode thereof. On the other hand, the upper electrode thereof is wire-bonded with the transmission line 52c. In this arrangement, the static testing may be carried out by, wire-bonding the second pad 52h with the transmission line 52f, wire-bonding the pad 52e for supplying the bias current with the other transmission line 52 and supplying the bias current between the second pad 52h and the other pad 52e. The dynamic testing may be carried out, after removing the temporary wires bonded to transmission lines, 52c and 52f, and applying the high frequency signal to respective transmission lines, 52c and 52f.

What is claimed is:

1. A transmitting optical sub-assembly, comprising:
 a semiconductor light-emitting device for emitting light by providing a modulation signal;
 a thermoelectric cooler for controlling a temperature of said semiconductor light-emitting device; and
 an insulating carrier including a first mounting surface and an inner ground layer, said first mounting surface providing a first transmission line for transmitting said modulation signal, a first terminator connected to said first transmission line and a surface ground layer connected to said inner ground layer,
 wherein said carrier is mounted on said thermoelectric cooler and said semiconductor light-emitting device is mounted on said first mounting surface of said carrier, and wherein said first mounting surface of said insulating carrier further includes a second transmission line and a second terminator connected to said second transmission line, and wherein said second transmission line transmits another modulation signal having a phase opposite to a phase of said modulation signal.

2. The transmitting optical sub-assembly according to claim 1, wherein said first terminator is connected in serial to said first transmission line.

3. The transmitting optical sub-assembly according to claim 1, wherein said first terminator is connected between said first transmission line and said surface ground layer.

4. The transmitting optical sub-assembly according to claim 1, wherein a first distance from said light-emitting device to said first terminator is shorter than a second distance from said light-emitting device to said second terminator.

5. The transmitting optical sub-assembly according to claim 4, further including a multi-layered ceramic substrate for transmitting said modulation signal and said another modulation signal to said carrier, wherein a difference between said first distance and said second distance is compensated on said multi-layered ceramic substrate.

6. The transmitting optical sub-assembly according to claim 1, wherein said first terminator is connected in serial to said first transmission line and said second terminator is connected in serial to said second transmission line.

7. The transmitting optical sub-assembly according to claim 1, wherein said first terminator is connected between said first transmission line and said surface ground plane, and said second terminator is connected between said second transmission line and said surface ground plane.

8. The transmitting optical sub-assembly according to claim 1, further comprising a package having a package ground, wherein said surface ground in said carrier is isolated from said package ground within said package.

9. The transmitting optical sub-assembly according to claim 1, wherein said insulating carrier is made of aluminum nitride.

10. A transmitting optical sub-assembly comprising:

a semiconductor light-emitting device for emitting light by providing a modulation signal;

a thermoelectric cooler for controlling a temperature of said semiconductor light-emitting device;

an insulating carrier made of aluminum nitride, said insulating carrier including a first mounting surface, a second mounting surface and an inner ground layer, said first mounting surface providing a first transmission line, a first terminator and a surface ground layer, said first transmission line transmitting said modulation signal, and first terminator being connected to said first transmission line, and said surface ground layer being connected to said inner ground layer; and a lens made of glass for collimating said light emitted from said light-emitting device, wherein said second mounting surface of said insulating carrier directly mounts said lens thereon without lens holder.

11. The transmitting optical sub-assembly according to claim 10, wherein a level of said first mounting surface is higher than a level of said second mounting surface.

12. The transmitting optical sub-assembly according to claim 1, wherein said light-emitting device comprises a semiconductor laser diode for generating light in a continuous wave by providing a bias current thereto through a bypass capacitor and a semiconductor optical modulator for modulating said light generated in said semiconductor laser diode by providing said modulation signal transmitted in said first transmission line.

13. The transmitting optical sub-assembly according to claim 12, wherein said semiconductor laser diode is integrally formed with said semiconductor optical modulator.

14. The transmitting optical sub-assembly according to claim 1, wherein said light-emitting device is a semiconductor laser diode, and said first terminator is connected in serial to said first transmission line.

15. A transmitting optical sub-assembly comprising:

a semiconductor laser diode having a first electrode and a second electrode, said laser diode emitting light by providing a modulation signal;

a thermoelectric cooler for controlling a temperature of said semiconductor light-emitting device;

an insulating carrier including a first mounting surface and an inner ground layer, said first mounting surface providing a first transmission line, a second transmission line, a first terminator, a second terminator, and a surface ground layer, said first transmission line transmitting said modulation signal with a first phase, said first terminator being connected in serial to said first transmission line, said second transmission line transmitting a second modulation signal with a second phase opposite to said first phase, said second terminator being connected in serial to said second transmission line, and said surface ground layer being connected to said inner ground layer wherein said first electrode of said semiconductor laser diode is connected to said first terminator for receiving said first modulation signal, and said second electrode of said semiconductor laser diode is connected to said second terminator for receiving said second modulation signal.

* * * * *